US006864038B2

(12) United States Patent
Mori

(10) Patent No.: US 6,864,038 B2

(45) Date of Patent: Mar. 8, 2005

(54) PRINTING PLATE MATERIAL

(75) Inventor: Takahiro Mori, Hachioji (JP)

(73) Assignee: Konica Corporation, Tokyo (JP)

(*) Notice: Subject to any disclaimer, the term of this patent is extended or adjusted under 35 U.S.C. 154(b) by 0 days.

(21) Appl. No.: 10/443,939

(22) Filed: May 22, 2003

(65) Prior Publication Data

US 2004/0081913 A1 Apr. 29, 2004

(30) Foreign Application Priority Data

May 30, 2002 (JP) ....................................... 2002-157217

(51) Int. Cl.$^7$ .................................................. G03F 7/11

(52) U.S. Cl. ................. 430/271.1; 430/138; 430/272.1; 430/273.1; 430/283.1

(58) Field of Search .............................. 430/138, 270.1, 430/271.1, 272.1, 273.1, 283.1, 302

(56) References Cited

U.S. PATENT DOCUMENTS

| | | | | | |
|---|---|---|---|---|---|
| 6,230,621 | B1 | * | 5/2001 | Verschueren et al. | 101/453 |
| 6,596,464 | B2 | * | 7/2003 | Van Damme et al. | 430/302 |
| 6,620,573 | B2 | * | 9/2003 | Van Damme et al. | 430/270.1 |
| 2004/0018443 | A1 | * | 1/2004 | Aoshima | 430/270.1 |

* cited by examiner

*Primary Examiner*—Barbara L. Gilliam

(74) *Attorney, Agent, or Firm*—Frishauf, Holtz, Goodman & Chick, P.C.

(57) ABSTRACT

A printing plate material is disclosed which comprises a substrate, and provided thereon, an under layer and a porous hydrophilic layer in that order, wherein the under layer has a thickness of from 0.1 to 5.0 $\mu$m, contains metal oxide particles A with a particle size of from 1 to 20 nm in an amount of not less than 30% by weight, and has cracks with a groove width of less than 1 $\mu$m.

15 Claims, No Drawings

PRINTING PLATE MATERIAL

FIELD OF THE INVENTION

The present invention relates to a printing plate material, and particularly to a printing plate material capable of forming an image by a computer to plate (hereinafter referred to also as CTP) system.

BACKGROUND OF THE INVENTION

A printing plate material for the CTP system, which is inexpensive, can be easily handled, and has a printing ability comparable with that of a PS plate, is required accompanied with the digitization of printing data. Recently, printing plate materials applied to various CTP systems, employing infrared laser has been proposed.

Of these CTP systems, there is a CTP system called a wet type CTP in which solubility of the image formation layer of a printing plate material is varied by imagewise exposure, followed by development with a liquid developer to form an image. However, this system has various problems, in that an exclusive alkali developer is required as in conventional PS plates, developability of developer used varies due to the developer conditions such as temperature or fatigue degree of the developer, image reproduction is not obtained, or operation under room light is restricted.

On the other hand, a printing plate material for so-called a dry CTP system, which does not require special development (including development on press), has been developed. The dry CTP system has been noticed, since it can be applied to a printing press for a direct imaging (DI) system, in which an image is formed directly on a printing plate material mounted on the printing press to obtain a printing plate, and printing is carried out employing the printing plate.

As a printing plate material for the dry CTP system, there is an ablation type printing plate material, for example, one which is disclosed in for example, Japanese Patent O.P.I. Publication Nos. 8-507727, 6-186750, 6-199064, 7-314934, 10-58636 and 10-244773.

These references disclose a printing plate material comprising a substrate and a hydrophilic layer or a lipophilic layer as an outermost layer. In the printing plate material having a hydrophilic layer as an outermost layer, the hydrophilic layer is imagewise exposed to imagewise ablate the hydrophilic layer, whereby the lipophilic layer is exposed to form image portions. However, there are problems that sensitivity is low, which requires great energy for ablation, and resolution is low on account of physical destruction of the hydrophilic layer, which results in lowering of dot quality.

Further, there is problem in which the interior of the exposing apparatus is contaminated by scattered matters caused by ablation of the surface layer. Therefore, the apparatus requires equipment of a special suction device or another cleaning device. In order to prevent the contamination during exposure, a printing plate material may be covered with a cover sheet. Further, a means (for example, a wipe-off device or a rinsing device) for removing scattered matter remaining on the printing plate material surface layer is required. The ablation method does not necessarily provide a complete dry system.

In the ablation type CTP system, a printing plate material has been sought which has good performance and excellent handling property.

Further, a printing plate material has been sought which is capable of forming an image without producing ablated matter and without any special development or cleaning treatment. There is one capable of being developed with dampening water (development on press) disclosed in, for example, Japanese Patent Nos. 2938397 and 2938398, which comprises an image formation layer containing thermoplastic polymer particles and a water soluble binder.

However, such a printing plate material, when a grained aluminum plate is used as a hydrophilic substrate, is required to contain a light heat conversion material (generally colored) in the image formation layer, and may contaminate a printing press in development on press.

In order to prevent such a contamination of a printing press due to development on press, a printing plate material, which comprises a hydrophilic support comprising a substrate and provided thereon, a hydrophilic layer containing a light heat conversion material, has been sought. The use of such a hydrophilic support makes it possible to remove a light heat conversion material from an image formation layer and to optionally select a substrate such as a PET (polyethylene terephthalate) film or an aluminum plate. It is difficult to give an excellent performance identical to the grained aluminum plate to the hydrophilic layer. Although many studies on a hydrophilic layer have been made, a printing plate material providing sufficient printing performance has not yet been obtained.

A hydrophilic layer containing a hydrophilic light heat conversion material is disclosed, for example in Japanese Patent O.P.I. Publication No. 2000-355178. In this publication, no reference is made to components other than the light heat conversion material, and there is description in the examples in which when printing is carried out employing dampening water containing IPA (isopropyl alcohol), no background contamination is not produced. The hydrophilic layer disclosed in the examples cannot be applied to a printing method employing an IP free dampening water which is sought for improvement of working environment.

Further, such a hydrophilic layer, which is formed by a coating method, is poor in layer strength as compared with a grained aluminum plate. Although the hydrophilic layer, when printing is carried out employing a coat paper sheet, can provide good prints, it has problems in that when printing is carried out employing an uncoated paper sheet, spotted layer exfoliation at non-image portions of the hydrophilic layer occurs due to paper powder, resulting in extreme lowering of printing durability. In order to enhance the hydrophilic layer and minimize a layer exfoliation, a hydrophilic layer has been proposed which contains an organic binder compound or a crosslinking agent. However, this hydrophilic layer has drawback in that background contamination is likely to be produced. As is described above, it is difficult to provide both good printing performance and high printing durability to uncoated paper to be printed.

SUMMARY OF THE INVENTION

The present invention has been made in view of the above. An object of the invention is to provide a printing plate material comprising a hydrophilic layer which can be applied to a CTP system which does not require special development, and provides good printing performance. Another object of the invention is to provide a printing plate material comprising a layer having high strength, which provides high printing durability even when printing is carried out employing an uncoated paper.

DETAILED DESCRIPTION OF THE INVENTION

The above object has been attained by one of the following constitutions:

1-1. A printing plate material comprising a substrate, and provided thereon, an under layer and a porous hydrophilic layer in that order, wherein the under layer has a thickness of from 0.1 to 5.0 μm, contains metal oxide particles A with a particle size of from 1 to 20 nm in an amount of not less than 30% by weight, and has cracks with a groove width of less than 1 μm.

1-2. The printing plate material of item 1-1 above, wherein the frequency of the cracks is such that when an arbitrary line with a length of 100 μm is drawn on the surface of the under layer, the line intersects with the cracks at points of from 1 to 100.

1-3. The printing plate material of item 1-1 above, wherein the metal oxide particles A are colloidal silica particles.

1-4. The printing plate material of item 1-1 above, wherein not less than 91% by weight of components constituting the hydrophilic layer are carbon atom-free materials.

1-5. The printing plate material of item 1-1 above, wherein the hydrophilic layer contains a light-heat conversion material.

1-6. The printing plate material of item 1-1 above, wherein the under layer further contains particles B with a particle size of from 50 nm to 1 μm.

1-7. The printing plate material of item 1-6 above, wherein the metal oxide particles B have a new Mohs' hardness of not less than 5.

1-8. The printing plate material of item 1-6 above, wherein the particles B are metal oxide particles having light-heat conversion function.

1-9. The printing plate material of item 1-6 above, wherein the particles B are organic particles having a Tg of not less than 100° C.

1-10. The printing plate material of item 1-9 above, wherein the organic particles are hollow.

1-11. The printing plate material of item 1-6 above, wherein the particles B are fatty acid amide particles.

1-12. The printing plate material of item 1-6 above, wherein the particles B are fatty acid amide particles.

1-13. The printing plate material of item 1-1 above, wherein the under layer further contains layer structural clay mineral particles.

1-14. The printing plate material of item 1-1 above, further comprising an image formation layer on the substrate.

1-15. The printing plate material of item 1-14 above, wherein the image formation layer contains at least one selected from the group consisting of heat-fusible particles and thermoplastic materials, and is provided on the hydrophilic layer.

1-16. The printing plate material of item 1-14 above, wherein the image formation layer further contains a water soluble material.

1-17. The printing plate material of item 1-16 above, wherein the water soluble material is a saccharide.

1-18. The printing plate material of item 1-17 above, wherein the saccharide is an oligosaccharide.

2-1. A printing plate material comprising a substrate, and provided thereon, an under layer and a porous hydrophilic layer in that order, wherein the under layer has a thickness of from 0.1 to 5.0 μm, contains metal oxide particles A with a particle size of from 1 to 20 nm in an amount of not less than 30% by weight, and has cracks with a groove width of less than 1 μm.

2-2. The printing plate material of item 2-1 above, wherein the cracks are formed in the under layer at a frequency such that when an arbitrary line with a length of 100 μm is drawn on the surface of the under layer, the line intersects with the cracks at points of from 1 to 100.

2-3. The printing plate material of item 2-1 or 2-2 above, wherein the metal oxide particles A are colloidal silica particles.

2-4. The printing plate material of any one of items 2-1 through 2-3 above, wherein not less than 91% by weight of components constituting the hydrophilic layer are carbon atom-free materials.

2-5. The printing plate material of any one of items 2-1 through 2-4 above, wherein the hydrophilic layer contains a light-heat conversion material.

2-6. The printing plate material of any one of items 2-1 through 2-5 above, wherein the under layer further contains particles B with a particle size of from 50 nm to 1 μm.

2-7. The printing plate material of item 2-6 above, wherein the metal oxide particles B have a new Mohs' hardness of not less than 5.

2-8. The printing plate material of item 2-6 or 2-7 above, wherein the particles B are metal oxide particles having light-heat conversion function.

2-9. The printing plate material of any one of items 2-6 through 2-8 above, wherein the particles B are organic particles having a Tg of not less than 100° C.

2-10. The printing plate material of item 2-9 above, wherein the organic particles are hollow.

2-11. The printing plate material of any one of items 2-6 through 2-10 above, wherein the particles B are fatty acid amide particles.

2-12. The printing plate material of any one of items 2-6 through 2-11 above, wherein the particles B are fatty acid amide particles.

2-13. The printing plate material of any one of items 2-1 through 2-12 above, wherein the under layer further contains layer structural clay mineral particles.

2-14. The printing plate material of any one of items 2-1 through 2-13 above, further comprising an image formation layer on the substrate.

2-15. The printing plate material of item 2-14 above, wherein the image formation layer contains at least one selected from the group consisting of heat-fusible particles and thermoplastic particles, and is provided on the hydrophilic layer.

2-16. The printing plate material of item 2-15 above, wherein the image formation layer further contains a water soluble material.

2-17. The printing plate material of item 2-16 above, wherein the water soluble material is a saccharide.

2-18. The printing plate material of item 2-17 above, wherein the saccharide is an oligosaccharide.

The present invention will be explained below.

The printing plate material of the invention comprises a substrate, and provided thereon, an under layer with a thickness of from 0.1 to 5.0 μm, and a porous hydrophilic layer in that order, wherein the under layer contains metal oxide particles A with a particle size of from 1 to 20 nm in an amount of not less than 30% by weight, and has cracks with a groove width of less than 1 μm.

The term, "cracks" herein referred to means those in which cracking is produced on a layer and discontinuity of the layer due to the cracking can be confirmed according to microscopic observation. The term, "groove width" herein referred to means layer discontinuity observed through a microscope, and the groove width is measured through a microscope. The layer discontinuity also includes one formed on the layer surface or at the vicinity of the layer surface.

The porous hydrophilic layer can provide good printing performance, but has problem in that the layer strength is relatively low. The under layer in the invention reinforces the hydrophilic layer (reinforcement effect) while maintaining good printing performance. The under layer in the invention contains metal oxide particles A (hereinafter also referred to as particles A) with a particle size of from 1 to 20 nm in an amount of not less than 30% by weight, and optionally contains a water soluble resin (described later) or a surfactant (described later). It is preferred in the invention that the under layer further contains particles B with a particle size of from 50 nm to 1 μm. The particles A have a self-film formation property, and can provide a metal oxide layer with high hydrophilicity and high water resistance without using a crosslinking agent. The under layer contains particles A in an amount of not less than 30% in order to enhance the layer. The content of the particles A in the under layer is preferably from 30 to 99.9% by weight, more preferably from 50 to 99% by weight, and most preferably from 60 to 95% by weight.

The under layer having a thickness of not more than 0.1 μm cannot provide a hydrophilic layer with sufficient strength. Further, the under layer having a thickness exceeding 5.0 μm lacks its flexibility, which results in lowering of the layer strength and printing performance.

The under layer in the invention is formed so as to have cracks with a groove width of less than 1 μm, whereby flexibility is given to the layer with high strength containing metal oxide particles as a main component, and durability is given to the layer. When the under layer is coated on a substrate, the particles A in the under layer produces layer shrinkage during its self-film formation stage at the drying step. The resulting shrinkage remains in the layer as internal stress of the layer, which may lower adhesive force of the layer, and may produce cracks with a groove width not less than 1 μm resulting in low durability of the layer. By control a groove width of the cracks of the under layer to fall within the range in the invention, the internal stress is relaxed, and adhesive force of the under layer to the substrate is enhanced. The cracks have a groove width of preferably not less than 0.5 μm, and more preferably from 0.01 to 0.5 μm.

The dry coated layer with no cracks has internal stress in the layer, and when external force is applied to such a layer, layer exfoliation is likely to occur over its relatively broad area, resulting in lowering of layer fastness.

The layer with cracks with a groove width of not less than 1.0 μm, shows that great shrinkage occurs due to drying of a coated layer and forms layer parts divided by the cracks in the coated layer, wherein internal stress, which remains in each layer part, is likely to cause exfoliation of the layer parts, resulting in lowering of the layer durability. Spotted stain at printed matter can be greatly minimized, which is likely to occur due to spotted layer exfoliation at non-image portions of the layer, when printing is carried out employing an uncoated paper sheet.

The printing plate material of the invention having the under layer and the hydrophilic layer described above provides an excellent printing performance resulting from the high porosity of the hydrophilic layer and increases durability of the hydrophilic layer resulting from the reinforcement effect of the under layer.

It is preferred in the printing plate material of the invention that the cracks in the under layer are formed at a frequency such that when an arbitrary line with a length of 100 μm is drawn on the surface of the under layer, the line intersects with the cracks at an intersection point number of from 1 to 100. This means that the layer is divided by the cracks to form layer parts in the form of mosaic tile, in which the distance between two adjacent cracks is from 1 to 100 μm. The intersection point number is preferably from 5 to 80, and more preferably from 10 to 50.

In the coated layer having the cracks described above, when spotted external force is applied to the layer, a part of the layer in the tile form, to which the external force has been applied, may exfoliate but the external force is difficult to reach a layer adjacent thereto. As a result, layer exfoliation can be minimized.

In the printing plate material comprising such an under layer having the structure as described above, even when great external force exfoliating a part of the under layer is applied to the printing plate material, the area of the layer to be exfoliated can be minimized. Further, even when printing ink is adhered to the substrate exposed due to the exfoliation of the under layer during printing, ink stains cannot be visually observed on the printed matter, which is not substantially problematic.

The intersection point number of from 1 to 100 described above increases adhesive force of the layer and enhances layer durability.

The metal oxide particles A with a particle size of from 1 to 20 nm used in the under layer include a colloidal silica, an alumina sol, a titania sol and another metal oxide sol. It is known that in a layer formed by the self-film formation property of the metal oxide particles, a less particle size provides higher layer strength. A layer containing particles with a particle size exceeding 20 μm is low in its strength. On the other hand, a dispersion liquid containing particles with too small size lowers its dispersion stability. Therefore, the particle size of the metal oxide particles in the invention is preferably 3 to 12 nm. The metal oxide particles may have any shape such as spherical, needle-like, and feather-like shape. The shape of metal oxide particles is preferably spherical, in view of enhancing layer strength. Plural kinds of metal oxide particles with a particle size of from 1 to 20 nm each having a different average particle size may be used in combination. The surface of the particles may be subjected to surface treatment.

Among the above-mentioned, colloidal silica particles are particularly preferred as metal oxide particles A used in the invention. The colloidal silica has a high layer formation ability under a drying condition with a relative low temperature, and can provide a high layer strength. As the colloidal silica, acidic, alkaline, or neutral colloidal silica can be used. The alkaline colloidal silica particles are preferably used in providing higher layer strength.

Examples of the alkaline colloidal silica particles having a particle size within the foregoing range include Snowtex-20 (average particle size: 10 to 20 nm), Snowtex-30 (average particle size: 10 to 20 nm), Snowtex-40 (average particle size: 10 to 20 nm), Snowtex-N (average particle size: 10 to 20 nm), Snowtex-S (average particle size: 8 to 11 nm) and Snowtex-XS (average particle size: 4 to 6 nm), each produced by Nissan Kagaku Co., Ltd.

The porous hydrophilic layer of the printing plate material of the invention contains a carbon atom-free material in an amount of not less than 91% by weight. The hydrophilic layer contains the carbon atom-free material in an amount of preferably not less than 95% by weight. The upper limit of the carbon-atom free material content of the hydrophilic layer is not specifically limited, and it may be 100% by weight. Herein, the porous hydrophilic layer is a hydrophilic layer having voids in which the void content of the layer is from 1 to 70% by volume. The void content of the hydrophilic layer is preferably from 10 to 50% by volume.

Herein, the content (% by weight) of the carbon atom-free material in the hydrophilic layer implies a percentage by weight of the hydrophilic layer except for organic compounds, organic group parts of materials having an organic group, carbon black, or graphite. With respect to a carbon atom-free material surface treated with a carbon atom-containing material, the carbon atom-containing material only is regarded as a carbon atom-containing material.

In the above, materials constituting the hydrophilic layer in the invention are those contained in the solid hydrophilic layer to have been formed. Materials, which are contained in a coating liquid for the hydrophilic layer but vaporized while the coating liquid is coated on a substrate and dried, are excluded. Further, materials permeated into the pores of the porous materials after the hydrophilic layer has been formed are also excluded.

The hydrophilic layer, containing a carbon atom-free material in an amount of not less than 91% by weight, and preferably of not less than 95% by weight, reduces waste paper at the beginning of printing, reduces blanket contamination in printing, and provides a good printing performance such that prints without contamination are obtained over a long run of printing.

The carbon atom-free material used in the hydrophilic layer of the printing plate material of the invention is preferably a metal oxide.

The metal oxide preferably comprises metal oxide particles. Examples of the metal oxide particles include a colloidal silica, an alumina sol, a titania sol and another metal oxide sol. The metal oxide particles may have any shape such as spherical, needle-like, and feather-like shape. The average particle size is preferably from 3 to 100 nm, and plural kinds of metal oxide each having a different size may be used in combination. The surface of the particles may be subjected to surface treatment.

The metal oxide particles can be used as a binder, utilizing its layer forming ability. The metal oxide particles are suitably used in a hydrophilic layer since they minimize lowering of the hydrophilicity of the layer as compared with an organic compound binder.

Among the above-mentioned, colloidal silica is particularly preferred. The colloidal silica has a high layer forming ability under a drying condition with a relative low temperature, and can provide a good layer strength. It is preferred that the colloidal silica used in the invention is necklace-shaped colloidal silica or colloidal silica particles having an average particle size of not more than 20 nm, each being described later. Further, it is preferred that the colloidal silica provides an alkaline colloidal silica solution as a colloid solution.

The necklace-shaped colloidal silica to be used in the invention is a generic term of an aqueous dispersion system of a spherical silica having a primary particle size of the order of nm. The necklace-shaped colloidal silica to be used in the invention means a "pearl necklace-shaped" colloidal silica formed by connecting spherical colloidal silica particles each having a primary particle size of from 10 to 50 μm so as to attain a length of from 50 to 400 nm. The term of "pearl necklace-shaped" means that the image of connected colloidal silica particles is like to the shape of a pearl necklace. The bonding between the silica particles forming the necklace-shaped colloidal silica is considered to be —Si—O—Si—, which is formed by dehydration of —SiOH groups located on the surface of the silica particles. Concrete examples of the necklace-shaped colloidal silica include Snowtex-PS series produced by Nissan Kagaku Kogyo, Co., Ltd.

As the products, there are Snowtex-PS-S (the average particle size in the connected state is approximately 110 nm), Snowtex-PS-M (the average particle size in the connected state is approximately 120 nm) and Snowtex-PS-L (the average particle size in the connected state is approximately 170 nm). Acidic colloidal silicas corresponding to each of the above-mentioned are Snowtex-PS-S-O, Snowtex-PS-M-O and Snowtex-PS-L-O, respectively.

The necklace-shaped colloidal silica is preferably used in a hydrophilic layer as a porosity providing material for hydrophilic layer, and porosity and strength of the layer can be secured by its addition to the layer. Among them, the use of Snowtex-PS-S, Snowtex-PS-M or Snowtex-PS-L, each being alkaline colloidal silica particles, is particularly preferable since the strength of the hydrophilic layer is increased and occurrence of background contamination is inhibited even when a lot of prints are printed.

As the colloidal silica particles, the above colloidal silica particles used as particles A can be used. The colloidal silica particles are preferably alkaline as described above, and the alkaline silica colloidal silica particles are preferably used in providing high layer strength and in preventing occurrence of background contamination.

When the colloidal silica particles and the necklace-shaped colloidal silica particles are used in combination, porosity of the layer is maintained and the layer strength is further increased.

The ratio of the colloidal silica particles having an average particle size of not more than 20 nm to the necklace-shaped colloidal silica is preferably from 95/5 to 5/95, more preferably from 70/30 to 20/80, and most preferably from 60/40 to 30/70.

The hydrophilic layer of the printing plate material of the invention can contain porous metal oxide particles as metal oxides. Examples of the porous metal oxide particles include porous silica particles, porous aluminosilicate particles or zeolite particles as described later.

(Porous Silica or Porous Aluminosilicate Particles)

The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to precipitate silica. The porosity and the particle size of such particles can be controlled by variation of the production conditions. The porous silica particles prepared from the gel by the wet method is particularly preferred.

The porous aluminosilicate particles can be prepared by the method described in, for example, JP O.P.I. No.

10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range of from 1:4 to 4:1. Complex particles composed of three or more components prepared by an addition of another metal alkoxide may also be used in the invention. In such a particle, the porosity and the particle size can be controlled by adjustment of the production conditions.

The porosity of the particles is preferably not less than 1.0 ml/g, more preferably not less than 1.2 ml/g, and most preferably of from 1.8 to 2.5 ml/g, in terms of pore volume before the dispersion.

The pore volume is closely related to water retention of the coated layer. As the pore volume increases, the water retention is increased, contamination is difficult to occur, and the water retention latitude is broad. Particles having a pore volume of more than 2.5 ml/g are brittle, resulting in lowering of durability of the layer containing them. Particles having a pore volume of less than 0.5 ml/g may be insufficient in printing performance.

<Zeolite Particles>

Zeolite is a crystalline aluminosilicate, which is a porous material having voids of a regular three dimensional net work structure and having a pore size of 0.3 to 1 nm. Natural and synthetic zeolites are expressed by the following formula.

$$(M_1\cdot(M_2)_{0.5})_m(Al_mSi_nO_{2(m+n)})\cdot xH_2O$$

In the above, $M_1$ and $M_2$ are each exchangeable cations. Examples of $M_1$ include $Li^+$, $Na^+$, $K^+$, $Tl^+$, $Me_4N^+$ (TMA), $Et_4N^+$ (TEA), $Pr_4N^+$ (TPA), $C_7H_{15}N^{2+}$, and $C_8H_{16}N^+$, and examples of $M^2$ include $Ca^{2+}$, $Mg^{2+}$, $Ba^{2+}$, $Sr^{2+}$ and $C_8H_{18}N_2^{2+}$. Relation of n and m is $n \geqq m$, and consequently, the ratio of m/n, or that of Al/Si is not more than 1. A higher Al/Si ratio shows a higher content of the exchangeable cation, and a higher polarity, resulting in higher hydrophilicity. The Al/Si ratio is within the range of preferably from 0.4 to 1.0, and more preferably 0.8 to 1.0. x is an integer.

Synthetic zeolite having a stable Al/Si ratio and a sharp particle size distribution is preferably used as the zeolite particles to be used in the invention. Examples of such zeolite include Zeolite A: $Na_{12}(Al_{12}Si_{12}O_{48}).27H_2O$; Al/Si=1.0, Zeolite X: $Na_{86}(Al_{86}Si_{106}O_{384}).264H_2O$; Al/Si=0.811, and Zeolite Y: $Na_{56}(Al_{56}Si_{136}O_{384}).250H_2O$; Al/Si=0.412.

Containing the porous zeolite particles having an Al/Si ratio within the range of from 0.4 to 1.0 in the hydrophilic layer greatly raises the hydrophilicity of the hydrophilic layer itself, whereby contamination in the course of printing is inhibited and the water retention latitude is also increased. Further, contamination caused by a finger mark is also greatly reduced. When Al/Si is less than 0.4, the hydrophilicity is insufficient and the above-mentioned improving effects are lowered.

The particle size of the porous metal oxide particles is preferably not more than 1 $\mu$m, and more preferably not more than 0.5 $\mu$m. Use of the porous metal oxide particles having such a size minimizes stains at non-image portions or stains on a blanket during printing.

The hydrophilic layer of the printing plate material of the invention can contain layer structural clay mineral particles as a metal oxide. Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

With respect to the size of the planar structural mineral particles, the particles have an average particle size (an average of the largest particle length) of preferably not more than 20 $\mu$m, and more preferably not more than 10 $\mu$m, and an average aspect ratio (the largest particle length/the particle thickness) of preferably not less than 20, and more preferably not less than 50, in a state contained in the layer including the case that the particles are subjected to a swelling process and a dispersing layer-separation process. When the particle size is within the foregoing range, continuity to the parallel direction, which is a trait of the layer structural particle, and softness, are given to the coated layer so that a strong dry layer in which a crack is difficult to be formed can be obtained. The coating solution containing the layer structural clay mineral particles in a large amount can minimize particle sedimentation due to a viscosity increasing effect. The particle size greater than the foregoing may lower the effect of preventing scratches from being produced. The aspect ratio lower than the foregoing reduces may provide poor flexibility, and may also lower the effect of preventing scratches from being produced.

The content of the layer structural clay mineral particles is preferably from 0.1 to 30% by weight, and more preferably from 1 to 10% by weight based on the total weight of the layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

An aqueous solution of a silicate is also usable as another carbon atom-free additive in the hydrophilic layer in the invention. An alkali metal silicate such as sodium silicate, potassium silicate or lithium silicate is preferable, and the $SiO_2/M_2O$ (M: alkali metal) is preferably selected so that the pH value of the coating liquid after addition of the silicate does not exceed 13 in order to prevent dissolution of the inorganic particles.

An inorganic polymer or an inorganic-organic hybrid polymer prepared by a sol-gel method employing a metal alkoxide. Known methods described in S. Sakka "Application of Sol-Gel Method" or in the publications cited in the above publication can be applied to prepare the inorganic polymer or the inorganic-organic hybrid polymer by the sol-gel method.

Of these, a silica particle layer formed by a sol-gel method employing tetralkoxysilane does not contains a carbon atom.

When an alkyl group-containing alkoxysilane such as alkyltrialkoxysilane is used, the alkyl group remains in the formed silica particle layer. In the invention, a material having such an alkyl group is regarded as a carbon atom-containing material.

The hydrophilic layer in the invention can contain a carbon atom-containing material in an amount of less than 9% by weight, and preferably less than 5% by weight.

Examples of the carbon atom-containing material include polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone.

A cationic resin may also be contained in the hydrophilic layer. Examples of the cationic resin include a polyalkylene-polyamine such as a polyethyleneamine or polypropylene-polyamine or its derivative, an acryl resin having a tertiary amino group or a quaternary ammonium group and diacrylamine. The cationic resin may be added in a form of particles. Examples of such particles include the cationic microgel described in Japanese Patent O.P.I. Publication No. 6-161101.

In the invention, it is preferred that the carbon atom-containing material contained in the hydrophilic layer is water soluble, and at least some of the material exist in the hydrophilic layer in a state capable of being dissolved in water. There is problem in that if a water soluble carbon atom-containing material is cross-linked by a crosslinking agent and is insoluble in water, its hydrophilicity is lowered, resulting in problem of lowering printing performance.

The carbon atom-containing water soluble material contained in the hydrophilic layer in the invention is preferably a saccharide. A combination of a hydrophilic layer containing the saccharide and an image formation layer described later provides high printing durability and an image with high resolution.

As the saccharide, an oligosaccharide detailed later can be used, but a water soluble polysaccharide is preferably used.

As the water soluble polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable.

These polysaccharides can form a preferred surface shape of the hydrophilic layer.

The surface of the hydrophilic layer preferably has a convexoconcave structure having a pitch of from 0.1 to 50 $\mu$m such as the grained aluminum surface of an aluminum PS plate. The water retention ability and the image maintaining ability are raised by such a convexoconcave structure of the surface. Such a convexoconcave structure can also be formed by adding in an appropriate amount a filler having a suitable particle size to the coating liquid of the hydrophilic layer. However, the convexoconcave structure is preferably formed by coating a coating liquid for the hydrophilic layer containing the alkaline colloidal silica and the water-soluble polysaccharide so that the phase separation occurs at the time of drying the coated liquid, whereby a structure is obtained which provides a good printing performance.

The shape of the convexoconcave structure such as the pitch and the surface roughness thereof can be suitably controlled by the kinds and the adding amount of the alkaline colloidal silica particles, the kinds and the adding amount of the water-soluble polysaccharide, the kinds and the adding amount of another additive, a solid concentration of the coating liquid, a wet layer thickness or a drying condition.

The pitch in the convexoconcave is preferably 0.2 to 30 $\mu$m, and more preferably 0.5 to 20 $\mu$m. The multiple convexoconcave may be formed in which, on a first convexoconcave, a second convexoconcave with a pitch less than that of the first convexoconcave is provided.

The hydrophilic layer has an average surface roughness Ra of preferably from 100 to 1000 nm, and more preferably from 150 to 600 nm.

The thickness of the hydrophilic layer is preferably from 0.01 to 50 $\mu$m, and more preferably from 0.5 to 3 $\mu$m.

A hydrophilic layer coating liquid for the hydrophilic layer can contain a water soluble surfactant in order to improve coatability. As the surfactant, a silicon containing surfactant, a fluorine-containing surfactant or an acetylene-glycol type surfactant can be used. The surfactant content of the coating liquid is preferably from 0.01 to 3% by weight, and more preferably from 0.03 to 1% by weight.

The hydrophilic layer coating liquid for the hydrophilic layer can also contain a pH adjusting agent. A coating liquid for a hydrophilic layer containing as a main component alkaline colloidal silica particles as described above has a pH of preferably from 9 to 13, and more preferably from 10 to 12. As the pH adjusting agent, sodium hydroxide or phosphoric acid salts can be used. In the invention, phosphoric acid salts are preferably used. Examples of the phosphoric acid salts include sodium phosphate and sodium hydrogen phosphate. The addition of the phosphoric acid salt not only adjusts a pH of the hydrophilic layer coating liquid, but improves reproduction of the shadow portions of prints. The addition amount of the phosphoric acid salt except for hydrate in the coating liquid is preferably from 0.1 to 5% by weight, and more preferably from 0.5 to 2% by weight, provided that the pH of the liquid does not exceed 13.

The hydrophilic layer in the invention can contain a light heat conversion material. Examples of the light heat conversion material include the following substances.

Examples of the light-heat conversion material include a general infrared absorbing dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

(Pigment)

Examples of pigment include carbon, graphite, a metal and a metal oxide. Furnace black and acetylene black is preferably used as the carbon. The graininess ($d_{50}$) thereof is preferably not more than 100 nm, and more preferably not more than 50 nm.

The graphite is one having a particle size of preferably not more than 0.5 $\mu$m, more preferably not more than 100 nm, and most preferably not more than 50 nm.

As the metal, any metal can be used as long as the metal is in a form of particles having preferably a particle size of not more than 0.5 $\mu$m, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions or materials which are electro-conductive or semi-conductive can be used. Examples of the former include black iron oxide ($Fe_3O_4$), and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2O.nTiO_2$ with these metal oxides is usable. The particle size of these particles is preferably not more than 0.5 μm, more preferably not more than 100 nm, and most preferably not more than 50 nm.

Among these light heat conversion materials, the carbon atom-containing materials can be added to the hydrophilic layer in an amount of preferably less than 9% by weight, and more preferably less than 5% by weight based on the total amount of carbon atom-containing materials used. Among these light heat conversion materials, black complex metal oxides containing at least two metals are preferred. Typically, the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light heat conversion efficiency as compared with another metal oxide.

The primary average particle size of these complex metal oxides is preferably from 0.001 to 1.0 μm, and more preferably from 0.01 to 0.5 μm. The primary average particle size of from 0.001 to 1.0 μm improves a light heat conversion efficiency relative to the addition amount of the particles, and the primary average particle size of from 0.05 to 0.5 μm further improves a light heat conversion efficiency relative to the addition amount of the particles. The light heat conversion efficiency relative to the addition amount of the particles depends on a dispersity of the particles, and the well-dispersed particles have a high light heat conversion efficiency. Accordingly, these complex metal oxide particles are preferably dispersed according to a known dispersing method, separately to a dispersion liquid (paste), before being added to a coating liquid for the particle containing layer. The metal oxides having a primary average particle size of less than 0.001 are not preferred since they are difficult to disperse. A dispersant is optionally used for dispersion. The addition amount of the dispersant is preferably from 0.01 to 5% by weight, and more preferably from 0.1 to 2% by weight, based on the weight of the complex metal oxide particles. The dispersant used is not specifically limited, but is preferably a Si-containing surfactant.

The addition amount of the complex metal oxide is preferably 0.1 to 50% by weight, more preferably 1 to 30% by weight, and most preferably 3 to 25% by weight based on the weight of hydrophilic layer or under layer.

The under layer in the invention preferably contains particles B with a particle size of from 50 nm to 1 μm, in addition to the metal oxide particles A. The metal oxide particles A are added to the under layer for self film-forming. The particles B are added to the under layer in order to provide various functions described later, and relax layer shrinkage at the drying step during coating, whereby crack formation is controlled to produce the cracks described above. The particle size of the particles B is preferably from 50 nm to 0.5 μm, and more preferably less than the layer thickness of the under layer. The particle size of the particles B of from 50 nm to 1 μm is preferred in that the crack formation controlling effect described above is enhanced.

The content of particles B in the under layer is preferably from 0.1 to 70% by weight, more preferably from 1 to 50% by weight, and still more preferably from 5 to 40% by weight.

As one embodiment of the invention, the under layer in the printing plate material preferably contains, as particles B, metal oxide particles having a new Moh's hardness of not less than 5. Examples of the metal oxide particles having a new Moh's hardness of not less than 5 include non-porous metal oxide particles (for example, particles of silica, alumina, titania, zirconia, iron oxide, or chromium oxide), metal carbide particles (for example, silicon carbide particles), boron nitride particles, and diamond particles.

The non-porous metal oxide particles are preferably those having a specific surface area of preferably not more than 50 $m^2/g$, and more preferably not more than 10 $m^2/g$ in terms of a BET value.

As the silica particles, spherical colloidal silica particles having a particle size of not less than 50 nm are preferably used.

The above embodiment increases strength of the under layer self and the surface hardness of the under layer, which not only prevents layer exfoliation due to spot pressure, but increases adhesion between the hydrophilic layer and the under layer. Stain, which is likely to occur on the printed matter due to spotted layer exfoliation, when printing is carried out employing an uncoated paper sheet, can be efficiently restrained.

As another embodiment of the invention, when the particles B are contained in the under layer of the printing plate material, particles B are preferably metal oxide particles with light heat conversion function. This restrains sensitivity from lowering when an aluminum substrate or a thin hydrophilic layer is applied.

When the particles B are metal oxide particles with light heat conversion function, the under layer has a function of supplementing the light heat conversion function of the hydrophilic layer.

The metal oxide particles having light heat conversion capability include titanium black and black complex metal oxides as described above.

As another embodiment of the invention, the under layer of the printing plate material of the invention contains organic particles having a Tg of not less than 100° C. or hollow organic particles, as particles B. In this embodiment, particles B are preferably hollow organic particles having a Tg of not less than 100° C. Herein, the hollow organic particles are particles having voids therein in which the ratio of the diameter of the voids to the outside diameter of the particles is from 0.10 to 0.99. In the hollow organic particles, the ratio of the diameter of the voids to the outside diameter of the particles is preferably from 0.30 to 0.90.

Some under layers employing organic particles having a Tg less than 100° C. do not provide sufficient layer strength. The upper limit of Tg of the organic particles is not specifically limited.

In the printing plate material comprising a substrate and a hydrophilic layer containing a light heat conversion material, in which an image is formed by heating the hydrophilic layer due to infrared laser exposure, the printing plate material employing an aluminum plate as the substrate is lower in sensitivity than that employing a resin substrate as the substrate. The reason is that the aluminum substrate has a good thermal conductivity and a part of heat generated in the hydrophilic layer transmits to the aluminum plate without being used for image formation. However, when the lower layer contains organic particles with a Tg of not less than 100° C. or hollow organic particles, thermal conductivity of the lower layer cab be lowered, and sensitivity lowering occurring when an aluminum plate is used can be minimized. Further, when hollow organic particles are used in the under layer of the printing plate material, the under layer shows a cushion property, which provides a printing plate minimizing stains caused due to scratching.

Addition of the porous inorganic particles to the under layer can decrease thermal conductivity of the layer, but it may lower a stain elimination property (described later) during printing. This is considered to be due to the fact that water absorption capacity of a layer comprised of the under layer and hydrophilic layer increases, and time increases which is taken from when supply of dampening water and ink for printing starts till when stable dampening water/ink balance is attained.

As another embodiment of the invention, there is a printing plate material comprising an under layer containing fatty acid amide particles as particles B.

The fatty acid amide particles can control crack production and improve layer coatability due to the effect of lowering the surface energy of the coated layer. After the hydrophilic layer and under layer are formed and heated, a part of the fatty acid amide particles moves to the surface of the hydrophilic layer, lowering the surface energy of the hydrophilic layer. When the surface energy is divided into a polarity component and a dispersion component, the dispersion component is lowered, which provides a hydrophilic surface with high ink repellency and improves printing performance.

As the fatty acid amide particles, palmitic acid amide and stearic acid amide are preferred. An emulsion containing the particles (and optionally a dispersant) can be used.

The fatty acid amide particles are low in the mechanical strength, and the content of fatty acid amide particles in the under layer is preferably from 0.1 to 10% by weight, and more preferably from 0.5 to 5% by weight.

As still another embodiment of the invention, there is a printing plate material comprising an under layer containing particulate dispersion phases as particles B, containing water soluble polysaccharides, in which are formed by phase separation occurring at the time of drying the coated liquid.

As the water soluble polysaccharides, starches, celluloses, polyuronic acid and pullulan can be used. Among them, cellulose derivatives such as methyl cellulose, carboxymethyl cellulose or its salt, and hydroxyethyl cellulose are preferable, and a sodium or ammonium salt of carboxymethyl cellulose is more preferable.

As described above, a convexoconcave structure of the hydrophilic layer can be formed by coating a coating liquid for the hydrophilic layer containing a water-soluble polysaccharide such as carboxymethyl cellulose sodium salt so that the phase separation occurs at the time of drying the coated liquid, whereby a structure is obtained which provides a good printing performance. When an under layer is formed employing a coating liquid containing a combination of the alkaline colloidal silica particles as particles A and the polysaccharides, phase separation also occurs at the time of drying the coated liquid. As s result, particulate dispersion phases with a particle size of not more than 1 μm are formed in the under layer to form a white colored under layer, which controls cracks in the coated layer.

The feature of this embodiment is that the particles do not sediment and hydrophilicity of the coated layer is not lowered, since materials used are water soluble.

The under layer of the printing plate material of the invention can contain layer structural clay mineral particles. The under layer containing the layer structural clay mineral particles alone can control cracks of the coated layer to some extent, but a combination of the layer structural clay mineral particles and the particles B further increases a crack controlling capability. Particularly when the particles B are inorganic particles, the layer structural clay mineral particles function as an antisettling agent for the inorganic particles.

Examples of the layer structural clay mineral particles include those described above as additives in the hydrophilic layer. As the layer structural clay mineral particles, smectite is preferable, and montmorillonite is more preferable.

In the embodiments described above, particles B (such as metal oxide particles with a new Moh's hardness of not less than 5, metal oxide particles having a light heat conversion capability, organic particles with a Tg of not less than 100° C., hollow organic particles, fatty acid amide particles and water soluble polysaccharides) can be used in combination, and the combined use provides the additive effect in which the effect of each particle is combined. Further, layer structural clay mineral particles can be added to the under layer.

Examples of the water soluble resin optionally contained in the under layer include water soluble polysaccharides such as starches, cellulose derivatives such as methyl cellulose, hydroxyethyl cellulose, and carboxymethyl cellulose or its salt, polyuronic acid, and pullulan. Examples of the surfactant optionally contained in the under layer include silicon-containing surfactant.

In the printing plate material of the invention having a hydrophilic layer, an image can be formed by imagewise providing a lipophilic material directly on the surface of the hydrophilic layer.

As one of the methods of imagewise providing the lipophilic material, there is a method of employing a known thermal transfer process. For example, there is a method of imagewise transferring a heat fusible ink of an ink ribbon having a heat fusible ink layer onto the surface of the hydrophilic layer employing a thermal head.

There is also a method of mounting the printing plate material on an exposure drum of a digital proof apparatus employing an infrared laser heat fusion transfer process, with the hydrophilic layer outwardly, further providing an ink sheet having an ink layer on the hydrophilic layer so that the ink layer contacts the hydrophilic layer, and then imagewise exposing the ink sheet by infrared laser to imagewise transfer a heat fusible ink of the ink layer onto the surface of the hydrophilic layer. In this case, a light heat conversion material may be contained in the hydrophilic layer of the printing plate material, in the ink sheet, or in both hydrophilic layer and ink sheet.

An image, which has been formed on the hydrophilic layer of the printing plate material employing a heat fusible ink, can be more firmly adhered to the hydrophilic layer by heating the printing plate material. When the hydrophilic layer contains a light heat conversion material, the heating can be carried out employing an infrared laser exposure or a flush exposure such as a xenon lamp exposure.

As another method of imagewise providing the lipophilic material, there is a method of employing a known ink jet process. In this case, inks used include a lipophilic ink disclosed in Japanese Patent Publication No. 2995075, a hot melt ink disclosed in Japanese Patent O.P.I. Publication No. 10-24550, a lipophilic ink, in which hydrophobic resin particles being a solid at ordinary temperature are dispersed, disclosed in Japanese Patent O.P.I. Publication No. 10-157053, and an aqueous ink, in which hydrophobic thermoplastic resin particles being a solid at ordinary temperature are dispersed.

When ink contains thermoplastic materials, after image formation, the printing plate material with the image can be heated so as to increase adhesion of the image on the hydrophilic layer.

A printing plate material with a hydrophilic layer containing light heat conversion materials can be heated employing flash light such as infrared laser of xenon lamp light.

In the ink jet system, a radiation hardenable ink is preferably used.

<<Radiation Curable Ink>>

The radiation curable ink capable of forming an image on the printing plate material of the invention contains at least a polymerizable compound, and can contain a colorant to produce a visible image.

As the colorant, a colorant such as a dye or pigment, which is soluble or dispersible in a main polymerizable compound, can be used. When pigment is used, dispersion treatment is carried out, since its degree of dispersion has a great influence on a color density. Devices for dispersing pigment include a ball mill, an atriter, a roll mill, an agitator, a Henschel mixer, a colloid mill, a supersonic homogenizer, a pearl mill, a wet jet mill, and a paint shaker. When pigment is dispersed, a dispersant can be added. As the dispersant, a polymer dispersant is preferably used, and preferred examples of the polymer dispersant include Solsperse series produced by Zeneca Co., Ltd. As an auxiliary dispersant, a synergist according to kinds of dispersant can be used. An addition amount of the dispersant or auxiliary dispersant is preferably from 1 to 50 parts by weight based on 100 parts by weight of pigment used. A dispersion medium is a solvent or a polymerizable compound. It is preferred that the radiation curable ink used in the invention does not contain a solvent, since it is hardened immediately after jetted to an image recording medium. The residual solvent in the hardened image results in lowering of solvent resistance and problem of VOC. The dispersion medium is preferably a polymerizable compound, and more preferably a monomer having the lowest viscosity among monomers.

Pigment, a dispersant, a dispersion medium, dispersing conditions and a filtration condition are determined to obtain pigment particles with an average particle size of preferably from 0.08 to 0.3 $\mu$m, a maximum particle size of from 0.3 to 10 $\mu$m, and preferably from 0.3 to 3 $\mu$m. The above range of the particle size can prevent clogging of an ink head nozzle, and provide excellent ink storage stability, ink transparency and ink curing sensitivity.

The colorant content of ink is preferably from 0.1 to 10% by weight. As radiation polymerizable compounds, there are known radical polymerizable compounds such as photo-curable compounds used in the photopolymerizable composition disclosed in Japanese Patent O.P.I. Publication Nos. 7-159983, 8-224982, and 10-863 and Japanese Patent Publication No. 7-31399, or cation polymerization photo-curable compounds. Recently, cation polymerization photo-curable resins sensitive to light having a wavelength identical to or longer than that of visible light are disclosed in Japanese Patent O.P.I. Publication Nos. 6-43633 and 8-324137.

The radical polymerizable compound is an ethylenically unsaturated compound capable of being polymerized by a radical, and is any compound, as long as it has at least one ethylenically unsaturated double bond in the molecule. The radical polymerizable compound may have any structure in the form of monomer, oligomer or polymer. The radical polymerizable compound can be used singly or in combination of two or more kinds in any content ratio, according to the objects of the usage. A polyfunctional compound having at least two functional groups is preferable to a monofunctional compound. Use of two kinds or more of the polyfunctional compound is more preferable in controlling physical properties or performance of ink.

The ethylenically unsaturated compound, which is capable of being polymerized by a radical, includes an unsaturated carboxylic acid such as acrylic acid, methacrylic acid, itaconic acid, crotonic acid, isocrotonic acid, or maleic acid or its salt, ester, urethane, amide or anhydride; acrylonitrile; styrene; unsaturated polyesters; unsaturated polyethers; unsaturated polyamides; and unsaturated polyurethanes. The examples include an acrylic acid derivative such as 2-ethylhexyl acrylate, 2-hydroxyethyl acrylate, butoxyethyl acrylate, carbitol acrylate, cyclohexyl acrylate, tetrahydrofurfuryl acrylate, benzyl acrylate, bis(4-acryloxypolyethoxyphenyl)propane, neopentyl glycol diacrylate, 1,6-hexanediol diacrylate, ethylene glycol diacrylate, diethylene glycol diacrylate, triethylene glycol diacrylate, tetraethylene glycol diacrylate, polyethylene glycol diacrylate, polypropylene glycol diacrylate, pentaerythritol triacrylate, pentaerythritol tetraacrylate, dipentaerythritol tetraacrylate, trimethylolpropane triacrylate, tetramethylolmethane tetraacrylate, oligo ester acrylate, N-methylol acryl amide, diacetone acryl amide, or epoxy acrylate; a methacrylic acid derivative such as methyl methacrylate, n-butyl methacrylate, 2-ethylhexyl methacrylate, lauryl methacrylate, allyl methacrylate, glycidyl methacrylate, benzyl methacrylate, dimethylaminomethyl methacrylate, 1,6-hexanediol dimethacrylate, ethylene glycol dimethacrylate, triethylene glycol dimethacrylate, polyethylene glycol dimethacrylate, polypropylene glycol dimethacrylate, trimethylolethane trimethacrylate, trimethylolpropane trimethacrylate, or 2,2-bis (4-methacryloxypolyethoxyphenyl)propane; an allyl compound such as alltl glycidyl ether, diallyl phthalate or triallyl trimellitate; and radical polymerizable or crosslinkable monomers, oligomers or polymers described in S. Yamashita et al., "Crosslinking agent Handbook", Taisei Co., Ltd. (1981), K. Kato et al., "UV, EB Hardenable Handbook (Materials)", Kobunshi Kankokai (1985), Radotek Kenkyukai, "UV, EB Hardening Technology, Application and Market", pp. 79, CMC Co. Ltd. (1989), and E. Takiyama, "Polyester Resin Handbook", Nikkan Kyogyo Shinbunsha (1988). The content of the radical polymerizable compound in ink is preferably from 1 to 97% by weight, and more preferably from 30 to 95% by weight.

Listed as cation polymerizable photo-curable resins may be a monomer (of mainly an epoxy type) which undergoes polymerization due to cationic polymerization, a UV curing prepolymer of an epoxy type, and a prepolymer having at least two epoxy groups in one molecule. Listed as such prepolymers may be, for example, alicyclic polyepoxides, polyglycidyl esters of polybasic acids, polyglycidyl ethers of polyhydric alcohols, polyglycidyl ethers of polyoxyalkylene glycol, polyglycidyl ethers of aromatic polyols, hydrogenated compounds of polyglycidyl ethers of aromatic polyols, urethane polyepoxy compounds and epoxylated polybutadine. Types of these polymers may be employed individually or in combinations of two or more types.

In the polymerizable compound in the invention, a (meth) acrylate type monomer or prepolymer, an epoxy type monomer or prepolymer, or a urethane type monomer or prepolymer, is preferably used.

More preferred examples of the polymerizable compound include 2-ethylhexyl-diglycolacrylate, 2-hydroxy-3-phenoxypropyl acrylate, 2-hydroxybutyl acrylate, hydroxypivalic acid neopentylglycol acrylate, 2-acryloyloxyethylphtharic acid, methoxy-polyethylene glycol acrylate, tetramethylolmethane triacrylate, 2-acryloyloxyethyl-2-hydroxyethylphtharic acid, dimethyloltricyclodecan diacrylate, ethoxylated phenyl acrylate, 2-acryloyloxyethylsuccinic acid, nonylphenol EO adduct acrylate, modified glycerin triacrylate, bisphenol A diglycidyl ether acrylic acid adduct, modified bisphenol A diacrylate, phenoxypolyethylene glycol acrylate, 2-acryloyloxyethylhexahydrophthalic acid, bisphenol A PO adduct diacrylate, bisphenol A EO adduct diacrylate, dipentaerythritol hexacrylate, pentaerythritol triacrylate, tolylenediisocyanateerethane prepolymer, lactone-modified flexible acrylate, butoxyethyl acrylate, propylene glycol diglycidyl ether acrylic acid adduct, pentaerythritol triacrylate hexamethylenediisocyanate urethane prepolymer, 2-hydroxyethyl acrylate, methoxydipropylene glycol acrylate, ditrimethylolpropane tetracrylate, pentaerythritol triacrylate hexamethylenediisocyanate urethane prepolymer, stearyl acrylate, isoamyl acrylate, isomyristyl acrylate, and isostearyl acrylate.

These acrylate compounds are less irritative or susceptible to skin (less poisoned), as compared to conventional polymerizable compound used in UV curable ink. These can lower a viscosity of ink, and can provide stable ink ejecting property, good polymerization sensitivity, and good adhesion to an ink recording medium. The content of the above compound in ink is from 20 to 95% by weight, preferably 50 to 95% by weight, and more preferably 70 to 95% by weight.

The monomers described above, if low molecular weight compounds, are less irritative, and have high reactivity, low viscosity, and excellent permeation or adhesion to the hydrophilic layer.

In order to improve sensitivity, bleeding and adhesion to the hydrophilic layer, a combined use of the monoacryltes described above and a polyfunctional acrylate monomer or polyfunctional acrylate oligomer having a molecular weight of not less than 400, and more preferably not less than 500 is preferred. As oligomers maintaining safety and further improving sensitivity, bleeding and adhesion to the hydrophilic layer, epoxyacrylate oligomer and urethaneacrylate oligomer are preferred.

A combine use of monoacrylates selected from the compounds described above and a polyfunctional acrylate monomer or oligomer is preferred in providing a flexible film, as well as high adhesion and film strength. The monoacrylates are preferably stearyl acrylate, isoamyl acrylate, isomyristyl acrylate, and isostearyl acrylate in providing high sensitivity and low shrinkage, preventing bleeding, minimizing ink odor of printed matter, and reducing cost.

Methacrylates are less irritative to skin than acrylates, but there are no substantial difference between those monomers with respect to susceptibility. Methacrylates have a sensitivity lower than acrylates, and are not suitable to use. However, methacrylate having high sensitivity and low susceptibility can be used. Alkoxyacrylates of the above monomers have problems with respect to sensitivity, bleeding, odor or an exposure source. It is preferred that the content of the alkoxyacrylates is less than 70 parts by weight, and the rest is another acrylate.

The radiation curable ink used in the invention can contain other additives, as necessary.

When an electron beam or X ray is used as an exposure source, initiators are not needed, but when UV light, visible light or infrared light is used as a light source, radical polymerization initiators, auxiliary initiators, or sensitizing dyes are used according to the respective wavelength of light. The addition amount of these compounds is 1 to 10 parts by weight based on the weight of ink. The initiators include conventional initiators, but are selected from those soluble in the above polymerizable compounds. Examples of the initiators include xanthone or isoxanthone compounds, benzophenone compounds, quinone compounds, and phosphine oxides.

Ink can contain polymerization inhibitors in an amount of 200 to 20000 ppm in order to increase ink storage stability. It is preferred that the ink used in the invention is heated to 40 to 80° C. to lower its viscosity, and ejected. Accordingly, polymerization inhibitors are preferably added to ink in order to prevent clogging of an ink head nozzle.

Besides the above, a surfactant, a leveling agent, a matting agent, and a polyester resin, a polyurethane resin, a vinyl resin, an acryl resin, a rubber resin or waxes for adjusting film properties is optionally added to ink. In order to increase adhesion to a recording medium such as a polyolefin or PET film, a tackifier which does not inhibit polymerization is preferably added to ink. Its typical examples include a high molecular weight sticky polymer disclosed on pages 5 and 6 of Japanese Patent O.P.I. Publication No. 2001-49200 (a copolymer comprising an ester of (meth) acrylic acid with alcohol having an alkyl group having 1 to 20 carbon atoms, an ester of (meth)acrylic acid with an alicyclic alcohol having 3 to 14 carbon atoms, or an ester of (meth)acrylic acid with an aromatic alcohol having 6 to 14 carbon atoms), and low molecular weight stickiness providing resins having a polymerizable unsaturated bond.

In order to improve adhesion to the hydrophilic layer, addition of a minute amount of an organic solvent is effective. The addition of the organic solvent in an amount within the range which does not produce problems in solvent resistance or VOC is effective, and the content of the organic solvent in ink is from 0.1 to 5% and preferably from 0.1 to 3%.

As a means for minimizing lowering of sensitivity due to shielding effect of the colorant used, radical cation hybrid curable ink such as a combination of cation polymerization monomer and an initiator having a long lifetime can be used.

The composition of ink is determined to provide an ink viscosity of preferably from 7 to 30 mPa·s, and more preferably from 7 to 20 mPa·s at an ink ejecting temperature in view of ink ejecting property. The ink viscosity is preferably from 35 to 500 mPa·s, and more preferably from 35 to 200 mPa·s at 25° C. Increase of ink viscosity at room temperature can prevent ink from permeating into a porous layer of an ink recording medium, reduce an uncured monomer and malodor, minimize bleeding, and improve image quality. A viscosity less than 35 mPa·s does not minimize bleeding, and a viscosity exceeding 500 mPa·s causes problem of ink delivery.

The surface tension of ink is preferably from 200 to 300 $\mu$N/cm, and more preferably from 230 to 280 $\mu$N/cm. A surface tension less than 200 $\mu$N/cm has problem in bleeding or permeation, and a surface tension exceeding 300 $\mu$N/cm has problem in wettability.

In the image formation method employing a radiation curable ink, it is preferred in ink ejecting stability to eject ink which viscosity is lowered by heating the above ink to 40 to 80° C. Since the radiation curable ink generally has an ink viscosity higher than aqueous inks, its variation of viscosity due to temperature variation is great. The variation of viscosity has a great influence on size of ink droplets or ink ejecting speed, or image quality, and therefore, it is necessary that temperature of the ink is maintained as constant as possible. The temperature of the ink is in the range of a set temperature±5° C., preferably a set temperature±2° C., and more preferably a set temperature±1° C. An ink jet recording apparatus has a means for stabilizing the ink temperature, and the sections in the apparatus where temperature is kept constant are pipe lines and members provided from ink tank (including an intermediate ink tank) to the ink nozzle for ejecting ink.

It is preferred that temperature is controlled according to ink flow rate or environmental temperature by plural temperature sensors provided at each pipe line. It is preferred that the head unit to be heated is thermally shielded or insulated without being influenced by temperature of the apparatus itself or environmental temperature. Further, it is preferred that the heating unit is low in heat content and thermally shielded from another section in order to shorten time necessary to heat or warming up time and reduce loss of heat energy.

As radiations used after ink ejecting, various radiations can be used, for example, UV light, electron beam, X ray, visible light, or infrared light. UV light is preferred in curing ability or cost. UV light sources include a mercury lamp, a metal halide lamp, an excimer lamp, and a UV laser, and an LED.

Fundamental radiation methods are disclosed in Japanese Patent O.P.I. Publication No. 60-132767, where light sources, which are provided on both sides of the head unit, are scanned by a shuttle method, radiation is carried out in a certain time after ink ejecting, and ink curing is completed employing another light source fixed. A method is disclosed in WO 9954415 in which optical fibers are used or collimated UV lights, which are projected on the mirror provided on the side of the head unit and reflected, are used for curing ejected ink. In the invention, these radiation methods can be used. It is preferred in the invention that radiation is carried out from the back of the head unit.

The method in which radiation is carried out from the back of the head unit can rapidly radiate ejected ink without using optical fibers or an expensive optical system. The radiation from the head unit back can prevent ink around ink nozzle from being cured by radiation reflected from an ink jet recording medium. The radiation source is preferably a cingulated source such that the radiation width projected on a recording medium is the same as one scanning.

Typically, a cingulated metal halide lamp tube or UV light lamp tube is preferred. The radiation lamp is fixed and unmovable, which can provide a cheap apparatus structure.

In any radiation methods, two radiation sources, a first and second radiation sources are provided. The second radiation source is preferably used for completing ink curing, which contributes to improvement of adhesion between a first ink firstly ejected and a second ink ejected after the first ink, improvement of wettability of the second ink, and cost reduction of the radiation source.

It is preferred that the wavelength or exposure intensity of the first radiation source is different from that of the second radiation source. The radiation energy of the first radiation source is preferably less than that of the second radiation source. The radiation energy of the first radiation source is from 1 to 20%, preferably from 1 to 10%, and more preferably from 1 to 5% of the total energy radiated. The above radiation method can provide a desirable molecular weight distribution of the molecule after cured. When high energy radiation is carried out one time, it increases polymerization yield, but produces a polymer with a low molecular weight and cannot obtain high strength of the ink. When ink having an extremely low ink viscosity such as ink for ink jet recording is used, the method provides a markedly advantageous effect.

The wavelength of the first radiation is longer than that of the second radiation, where the first radiation cures the surface of ink ejected on a recording medium to prevent ink bleeding, and the second radiation cures ink closer to the recording medium, which the first radiation is difficult to reach, to improve ink adhesion to the recording medium.

The ink jet recording process in the invention is characterized in that the ink described above is heated to a constant temperature, ejected on an ink recording medium, and exposed to radiation in 0.01 to 0.5 seconds, preferably 0.01 to 0.3 seconds, and more preferably 0.01 to 0.15 seconds after the ink is ejected on the recording medium. Shortening time from when the ink is ejected on the medium to when the ink is exposed to radiation can prevent ink from bleeding before the ink is hardened. Even when a porous recording medium is used, the method can expose the ink close to the medium, which the radiation is difficult to reach, before the ink is cured, which can reduce the residual unreacted monomer, and malorder. This can provide a great synergic effect in combination with the ink used in the invention. Particularly, ink having a viscosity at 25° C. of from 35 to 500 Pa·s can obtain a great effect. The method described above can keep a dot size of ink constant, which is ejected on various recording media which are different in the surface wettability, resulting in high quality images.

The head unit is comprised of an ink jet nozzle head, an ink supply system, ink, a temperature control system of a head or ink, and a controlling board. In the method in which radiation is carried out from the back of the head unit, projected area of the radiation on a recording medium is preferably less, which the first radiation is effectively carried out.

One example of the printing plate material of the invention is a printing plate material comprising a substrate and a functional layer capable forming an image (hereinafter also referred to as an image formation layer). The preferred example of the printing plate material of the invention is a printing plate material having a substrate and provided thereon, an under layer, a porous hydrophilic layer containing a light heat conversion material, and an image formation layer capable of forming an image by heat application in that order.

An image formation on the printing plate material of the invention is carried out by applying heat and preferably by infrared ray exposure.

Exposure applied in the invention is preferably scanning exposure, which is carried out employing a laser which can emit light having a wavelength of infrared and/or near-infrared regions, that is, a wavelength of from 700 to 1500 nm. As the laser, a gas laser can be used, but a semi-conductor laser, which emits light having a near-infrared region wavelength, is preferably used.

A device suitable for the scanning exposure in the invention may be any device capable of forming an image on the printing plate material according to image signals from a computer employing a semi-conductor laser.

Generally, the scanning exposures include the following processes.

(1) a process in which a plate material provided on a fixed horizontal plate is scanning exposed in two dimensions, employing one or several laser beams.

(2) a process in which the surface of a plate material provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) a process in which the surface of a plate material provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

In the invention, the process (3) above is preferable, and especially preferable when a printing plate material mounted on a plate cylinder of a printing press is scanning exposed.

As the process (3), a process as disclosed in, for example, Japanese Patent O.P.I. Publication No. 5-131676, can be used. Plural semi-conductor lasers are arranged in one line in the sub-scanning direction at a certain beam pitch, or plural semi-conductor lasers are arranged at a certain beam pitch in the sub-scanning direction and at certain intervals in the main scanning direction, that is, in two dimensions. The spot size of plural laser beams emitted from these semi-conductor lasers are reduced through an optical system comprising an optical fiber, a lens or a mirror so that the laser beams are focused on the plate material surface, and accordingly, the surface of the plate material is exposed with the reduced beam spots so as to give a predetermined exposure dissolving power. When the semi-conductor lasers are arranged in two dimensions, exposure of the plate material surface to the reduced beam spots is also carried out in two dimensions, and therefore, emission of each laser located in the main scanning direction is required to be delayed according to a generated image signal.

The sub-scanning of the laser light is generally carried out by moving an exposure head in the direction parallel to the rotational drum axis by a distance equal to a laser spot size multiplied by the laser beam number per one rotation of the drum. The exposure head may move at a constant speed from the beginning of the exposure till completion thereof, while controlled through a standard signal generated by rotation of the drum, that is, a spiral exposure may be carried out. The exposure head, when passing the part (generally, between the both ends of the plate material) on the drum at which the plate material is not present, may intermittently move by a predetermined distance. Further, a method as is disclosed in JPA-11-133620 may be used, which comprises a system countering a tendency for the laser beam to incline in the sub-scanning direction, while conducting spiral exposure.

In the invention, one example of the preferred structures of the printing plate material of the invention is one which comprises a substrate and provided thereon, an under layer, a porous hydrophilic layer and an image formation layer in that order. The image formation layer preferably contains at least one selected from heat fusible particles and thermoplastic particles. In this example, image formation is carried out by imagewise heating the image formation layer. For example, when the image formation layer is exposed to an infrared laser, the layer containing saccharides at exposed portions shows lipophilic property, and the layer at unexposed portions is removed to reveal a hydrophilic layer. In this case, the lipophilic property is given by fusion permeation of heat fusible particles into the porous hydrophilic layer and/or by fusion adhesion of thermoplastic particles to the porous hydrophilic layer.

The image formation layer can contain a water soluble material so that the layer at non-image portions can be easily removed with water. As the water soluble material, a known material can be used, but saccharides are preferably used.

Removal of the unexposed portions of the above image formation layer can be carried out dissolving saccharides in water. However, since the saccharide-containing layer is easily dissolved in water, the removal can be carried out on a press employing dampening water.

Removal of the image formation layer of the printing plate material on the press is carried out rotating the plate cylinder, on which the printing plate material is mounted, to bring an ink roller or a dampening water supply roller into contact with the layer. However, removal of the image formation layer containing saccharides does not require a specific system, and can be carried out conducting the same manner as in the beginning of printing of a conventional PS plate, which does not increase loss of prints at the beginning of printing.

Use of the saccharides does not lower hydrophilicity of the hydrophilic layer and can maintain good printing performance of the hydrophilic layer.

As the saccharide used in this example, oligosaccharide is preferably used. Use of the oligosaccharide does not inhibit the image formation in this example resulting from permeation of the heat fusible particles into the porous hydrophilic layer and/or fusion adhesion of the thermoplastic particles to the hydrophilic layer, and easily removes the unexposed portions of the layer.

The oligosaccharide is a water-soluble crystalline substance generally having a sweet taste, which is formed by a dehydration condensation reaction of plural monosaccharide molecules. The oligosaccharide is one kind of o-glycoside having a saccharide as the aglycon. The oligosaccharide is easily hydrolyzed by an acid to form a monosaccharide, and is classified according to the number of monosaccharide molecules of the resulting hydrolysis compounds, for example, into disaccharide, trisaccharide, tetrasaccharide, and pentasscharide. The oligosaccharide referred to in the invention means di- to deca-saccharides.

The oligosaccharide is classified into a reducing oligosaccharide and a non-reducing oligosaccharide according to presence or absence of a reducing group in the molecule. The oligosaccharide is also classified into a homo-oligosaccharide composed of the same kind of monosaccharide and a hetero-oligosaccharide composed of two or more kinds of monosaccharides.

The oligosaccharide naturally exists in a free state or a glycoside state. Moreover, various oligosaccharides are formed by glycosyl transition by action of an enzyme.

The oligosaccharide frequently exists in a hydrated state in an ordinary atmosphere. The melting points of the hydrated one and anhydrous one are different from each other as shown in the following Table 1.

TABLE 1

| Kinds of oligosaccharide | | Melting point (° C.) Hydrates | Anhydrides |
|---|---|---|---|
| Raffinose | Trisaccharide | 80 (Pentahydrate) | 118 |
| Trehalose | Disaccharide | 97 (Dihydrate) | 215 |
| Maltose | Disaccharide | 103 (Monohydrate) | 108 |
| Galactose | Disaccharide | 119 (Monohydrate) | 167 |
| Sucrose | Disaccharide | None | 182 |
| Lactose | Disaccharide | 201 | 252 |

In the invention, the layer containing a saccharide is preferably formed coating an aqueous coating solution containing the saccharide on a support. When an oligossccharide in the layer formed from the aqueous coating solution is one capable of forming a hydrate, the melting point of the oligosaccharide is that of its hydrate.

Among the oligosaccharides, trehalose with comparatively high purity is available on the market, and has an extremely low hygroscopicity, although it has high water solubility, providing excellent storage stability and excellent development property on a printing press.

When oligosaccharide hydrates are heat melted to remove the hydrate water and solidified, the oligosaccharide is in a form of anhydride for a short period after solidification. Trehalose is characterized in that a melting point of trehalose anhydride is not less than 100° C. higher that that of trehalose hydrate. This characteristics provides a high melting point and reduced heat fusibility at exposed portions of the trehalose-containing layer immediately after heat-fused by infrared ray exposure and re-solidified, preventing image defects at exposure such as banding from occurring.

In order to attain the object of the invention, trehalose is preferable among oligosaccharides. The oligosaccharide content of the layer is preferably from 1 to 90% by weight, and more preferably from 10 to 80% by weight, based on the total weight of the layer.

The heat fusible particles used in the invention are particularly particles having a low melt viscosity, or particles formed from materials generally classified into wax of thermoplastic materials. The materials preferably have a softening point of from 40° C. to 120° C. and a melting point of from 60° C. to 150° C., and more preferably a softening point of from 40° C. to 100° C. and a melting point of from 60° C. to 120° C. The melting point less than 60° C. has a problem in storage stability and the melting point exceeding 300° C. lowers ink receptive sensitivity.

Materials usable include paraffin, polyolefin, polyethylene wax, microcrystalline wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Among them, polyethylene, microcrystalline wax, fatty acid ester and fatty acid are preferably contained. A high sensitive image formation can be performed since these materials each have a relative low melting point and a low melt viscosity. These materials each have a lubrication ability. Accordingly, even when a shearing force is applied to the surface layer of the printing plate material, the layer damage is minimized, and resistance to contaminations which may be caused by scratch is further enhanced.

The heat fusible particles are preferably dispersible in water. The average particle size thereof is preferably from 0.01 to 10 μm, and more preferably from 0.1 to 3 μm. When a layer containing the heat fusible particles is coated on the porous hydrophilic layer, the particles having an average particle size less than 0.01 μm may enter the pores of the hydrophilic layer or the valleys between the neighboring two peaks on the hydrophilic layer surface, resulting in insufficient on press development and background contaminations. The particles having an average particle size exceeding 10 μm may result in lowering of dissolving power.

The composition of the heat fusible particles may be continuously varied from the interior to the surface of the particles. The particles may be covered with a different material. Known microcapsule production method or sol-gel method can be applied for covering the particles. The heat fusible particle content of the layer is preferably 1 to 90% by weight, and more preferably 5 to 80% by weight based on the total layer weight.

The thermoplastic particles in the invention include thermoplastic hydrophobic polymer particles. Although there is no specific limitation to the upper limit of the softening point of the thermoplastic hydrophobic polymer particles, the softening point is preferably lower than the decomposition temperature of the polymer particles. The weight average molecular weight (Mw) of the polymer is preferably within the range of from 10,000 to 1,000,000.

Examples of the polymer consisting the polymer particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co) polymer or a (meth)acrylic acid (co)polymer such as polymethyl methacrylate, a methyl methacrylate-(2-ethylhexyl) acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The polymer particles may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The thermoplastic particles are preferably dispersible in water. The average particle size of the thermoplastic particles is preferably from 0.01 to 10 μm, and more preferably from 0.1 to 3 μm. When a layer containing the thermoplastic particles having an average particle size less than 0.01 μm is coated on the porous hydrophilic layer, the particles may enter the pores of the hydrophilic layer or the valleys between the neighboring two peaks on the hydrophilic layer surface, resulting in insufficient on press development and background contaminations. The thermoplastic particles having an average particle size exceeding 10 μm may result in lowering of dissolving power.

Further, the composition of the thermoplastic particles may be continuously varied from the interior to the surface of the particles. The particles may be covered with a different material. As a covering method, known methods such as a microcapsule method and a sol-gel method are usable. The thermoplastic particle content of the layer is preferably from 1 to 90% by weight, and more preferably from 5 to 80% by weight based on the total weight of the layer.

The coating amount of the layer containing a saccharide in this example of the printing plate material is from 0.01 to 10 g/$m^2$, preferably from 0.1 to 3 g/$m^2$, and more preferably from 0.2 to 2 g/$m^2$.

(Substrate)

As the substrate in the invention, those well known in the art as substrates for printing plates can be used. Examples of the substrate include a metal plate, a plastic film, paper treated with polyolefin, and composite materials such as laminates thereof. The thickness of the substrate is not specifically limited as long as a printing plate having the substrate can be mounted on a printing press, and is advantageously from 50 to 500 μm in easily handling.

Examples of the metal plate include iron, stainless steel, and aluminum. Aluminum is especially preferable in its gravity and stiffness. Aluminum is ordinarily used after degreased with an alkali, an acid or a solvent to remove oil on the surface, which has been used when rolled and wound around a spool. The degreasing is carried out preferably employing an aqueous alkali solution. In order to increase adhesion between the substrate and a coating layer, it is preferred that the surface of the substrate is subjected to adhesion increasing treatment or is coated with a subbing layer. For example, the support is immersed in a solution containing silicate or a coupling agent such as a silane coupling agent, or the support is coated with the solution and then sufficiently dried. Anodization treatment is considered to be one kind of adhesion increasing treatment, and can be used. The anodization treatment and the immersing or coating treatment described above can be combined. Aluminum plate, which is surface-roughened with a conventional method, can be used.

Examples of the plastic film include a polyethylene terephthalate film, a polyethylene naphthalate film, a polyimide film, a polyamide film, a polycarbonate film, a polysulfone film, a polyphenylene oxide film, and a cellulose ester film. The plastic film is preferably a polyethylene terephthalate film, or a polyethylene naphthalate film. In order to increase adhesion between the substrate and a coating layer, it is preferred that the surface of the plastic film is subjected to adhesion increasing treatment or is coated with a subbing layer. Examples of the adhesion increasing treatment include corona discharge treatment, flame treatment, plasma treatment and UV light irradiation treatment. The subbing layers include a layer containing gelatin or latex.

The composite support can be obtained suitably laminating the above substrates. Laminating may be carried out before or after forming a coating layer. Further, laminating may be carried out immediately before mounting it on a printing press.

EXAMPLES

The invention will be detailed according to the following examples, but is not limited thereto.

Example 1

<<Preparation of Substrates 1 Through 3>>

(Substrate 1)

A 188 μm thick polyethylene terephthalate film (HS 74 produced by Teijin Co., Ltd.) with a subbing layer for an aqueous coating liquid was employed as substrate 1.

(Substrate 2)

A 50 μm thick polyethylene terephthalate film (HS 74 produced by Teijin Co., Ltd.) with a subbing layer for an aqueous coating liquid was laminated with a 240 μm thick aluminum plate (AA1050) through an adhesive, and aged at 40° C. for 48 hours to give a PET/aluminum composite plate. Thus, substrate 2 was obtained.

(Substrate 3)

A 0.24 mm thick aluminum plate (AA1050) was degreased with an aqueous sodium hydroxide solution, wherein the aluminum dissolution amount was 2 g/$m^2$. The resulting aluminum plate was sufficiently washed with pure water, immersed in a 1% by weight sodium dihydrogen phosphate aqueous solution at 70° C. for 30 seconds, then sufficiently washed with pure water, and dried to obtain substrate 3.

(Preparation of an Under Layer Coating Liquid)

Each material as shown in Table 2 was sufficiently mixed in an amount shown in Table 2 while stirring, employing a homogenizer, and filtered to obtain under layer coating liquids 1 through 15 (with a solid content of 15.0% by weight).

TABLE 2

| Material used | Under layer 1 | Under layer 2 | Under layer 3 | Under layer 4 | Under layer 5 | Under layer 6 | Under layer 7 | Under layer 8 | Under layer 9 | Under layer 10 | Under layer 11 | Under layer 12 | Under layer 13 | Under layer 14 | Under layer 15 |
|---|---|---|---|---|---|---|---|---|---|---|---|---|---|---|---|
| 1 | 74.93 | 67.43 | 57.68 | 59.18 | 65.93 | 62.18 | 67.43 | 50.93 | 53.93 | 71.18 | 72.68 | 57.68 | 46.68 | — | 22.50 |
| 2 | — | 1.50 | — | — | — | — | — | — | — | — | — | 1.50 | 2.25 | — | — |
| 3 | — | — | 3.00 | — | — | — | — | — | — | — | — | — | — | — | — |
| 4 | — | — | — | 7.50 | — | — | — | — | — | — | — | — | — | — | — |
| 5 | — | — | — | — | 3.75 | — | — | — | — | — | — | 1.88 | 3.75 | — | — |

TABLE 2-continued

| Material used | Under layer 1 | Under layer 2 | Under layer 3 | Under layer 4 | Under layer 5 | Under layer 6 | Under layer 7 | Under layer 8 | Under layer 9 | Under layer 10 | Under layer 11 | Under layer 12 | Under layer 13 | Under layer 14 | Under layer 15 |
|---|---|---|---|---|---|---|---|---|---|---|---|---|---|---|---|
| 6 | — | — | — | — | — | 2.25 | — | — | — | — | — | — | — | — | — |
| 7 | — | — | — | — | — | — | 2.59 | — | — | — | — | 1.85 | 1.85 | — | — |
| 8 | — | — | — | — | — | — | — | 4.50 | — | — | — | — | — | — | — |
| 9 | — | — | — | — | — | — | — | — | 3.75 | — | — | — | — | — | — |
| 10 | — | — | — | — | — | — | — | — | — | 3.75 | — | — | 1.50 | — | — |
| 11 | — | — | — | — | — | — | 3.75 | — | 3.75 | — | 3.75 | 3.75 | 3.75 | — | — |
| 12 | — | — | 9.00 | 3.00 | 6.00 | 6.00 | 6.00 | 6.00 | — | 6.00 | 6.00 | 6.00 | 6.00 | — | |
| 13 | 1.50 | 1.50 | 1.50 | 1.50 | 1.50 | 1.50 | 1.50 | 1.50 | 1.50 | 1.50 | 1.50 | 1.50 | 1.50 | 1.50 | 1.50 |
| 14 | — | — | — | — | — | — | — | — | — | — | — | — | — | 66.75 | 47.66 |
| Pure water | 23.57 | 29.57 | 28.82 | 28.82 | 22.82 | 28.07 | 18.73 | 37.07 | 31.07 | 23.57 | 16.07 | 25.84 | 30.72 | 25.75 | 28.34 |

In Table 2, numerical values represent parts by weight, and details of each material are as follows:

1: Colloidal silica (alkali type): Snowtex XS produced by Nissan Kagaku Co., Ltd. (particle size: 4–6 nm, solid 20% by weight)

2: Porous metal oxide particles Silton JC 40 (porous aluminosilicate particles having an average particle size of 4 $\mu$m, produced by Mizusawa Kagaku Co., Ltd.)

3: Porous metal oxide particles Silton AMT 08 (porous aluminosilicate particles having an average particle size of 0.6 $\mu$m, produced by Mizusawa Kagaku Co., Ltd.)

4: Colloidal silica (alkali type): Snowtex MP3040 produced by Nissan Kagaku Co., Ltd. (particle size: 0.3 $\mu$m, solid 40% by weight)

5: Colloidal silica (alkali type): Snowtex ZL produced by Nissan Kagaku Co., Ltd. (particle size: 0.1 $\mu$m, solid 40% by weight)

6: Alumina particles: Smicorandom AA-04 produced by Sumitomo Chemical Co., Ltd. (average particle size: 0.4 $\mu$m, powder with a Mohs' hardness of not less than 5)

7. Cu—Fe—Mn type metal oxide black pigment: TM-3550 black aqueous dispersion {prepared by dispersing TM-3550 black powder having a particle size of 0.1 $\mu$m produced by Dainichi Seika Kogyo Co., Ltd. in water to give a solid content of 40.5% by weight (including 0.5% by weight of dispersant)}

8: Organic particles: PMMA particles MP-1000 produced by Soken Kagaku Co., Ltd. (average particle size: 0.41 $\mu$m, powder with a Tg of not less than 100° C.)

9. Organic hollow particles: styrene-acryl resin hollow particles SX-866 (A) produced by JSR Co., Ltd. (average particle size: 0.3 $\mu$m, powder with a Tg of not less than 100° C.)

10. Stearylamide emulsion; Emulsion of stearylamide (Aqueous emulsion having a solid content of 20% by weight, average particle size: 0.3 $\mu$m)

11. Sodium carboxymethyl cellulose: Aqueous 4% by weight sodium carboxymethyl cellulose solution (Reagent produced by Kanto Kagaku Co., Ltd.)

12. Layer structural clay mineral particles: Montmorillonite Mineral Colloid MO gel prepared by vigorously stirring montmorillonite Mineral Colloid MO; gel produced by Southern Clay Products Co., Ltd. (average particle size: 0.1 $\mu$m) in water in a homogenizer to give a solid content of 5% by weight 13: 1 weight % aqueous solution of silicon-containing surfactant FZ2161 produced by Nippon Unicar Co., Ltd.

14: Aqueous lithium silicate solution produced by Nissan Kagaku Co., Ltd., solid content: 22% by weight

Example 1

The under layer coating liquid was coated on the substrate 1 to give an under layer with a dry thickness as shown in Table 3, and dried at 80° C. for 3 minutes. In order to obtain a desired thickness in the above coating of the under layer, an appropriate wire bar was selected or a coating liquid was diluted with a solvent. Thus, sample Nos. 1-1 through 1-17 were obtained.

The under layer of the resulting samples was evaluated for cracks on the surface and its performance according to the following methods. The results are shown in Table 3.

<Groove Width and Frequency of Cracks in the Under Layer>

The surface of the under layer was observed through a microscope VH7000 produced by KEYENCE Corporation.

The surface of the under layer was observed at a magnification of 300, and the groove width of the cracks was determined.

The surface of the under layer was observed at a magnification of 1000, and on the surface magnified by a magnification of 1000, two 100 $\mu$m long lines were drawn in a coating direction and two 100 $\mu$m long lines in a direction normal to the coating direction. Intersection points of each line and cracks were counted, and the average was determined as frequency of the cracks.

<Water Resistance and Durability of the Under Layer>

The surface of the under layer was rubbed 100 times with a sponge impregnated with water while supplying water onto the surface of the under layer, washed with water, and dried. The dried surface was visually observed and evaluated according to the following criteria:

5: No change
4: Slight scratches were observed.
3: Scratches were observed.
2: The under layer slightly exfoliated.
1: The under layer exfoliated.

TABLE 3

| Sample No. | Sub-strate No. | Under layer No. | Under layer Thick-ness (μm) | Groove width (μm) | Crack frequency (Intersection point number/100 μm) | Water resistance and durability | Remarks |
|---|---|---|---|---|---|---|---|
| 1-1 (Inv.) | 1 | 3 | 1.5 | not more than 0.5 | 30 | 4 | |
| 2-2 (Inv.) | 1 | 4 | 2.0 | not more than 0.5 | 30 | 5 | |
| 1-3 (Inv.) | 1 | 5 | 1.0 | not more than 0.5 | 30 | 5 | |
| 1-4 (Inv.) | 1 | 6 | 0.5 | not more than 0.5 | 40 | 5 | |
| 1-5 (Inv.) | 1 | 7 | 2.0 | not more than 0.5 | 30 | 4 | |
| 1-6 (Inv.) | 1 | 8 | 1.0 | not more than 0.5 | 30 | 4 | |
| 1-7 (Inv.) | 1 | 9 | 2.0 | not more than 0.5 | 30 | 4 | |
| 1-8 (Inv.) | 1 | 10 | 1.0 | not more than 0.5 | 30 | 4 | |
| 1-9 (Inv.) | 1 | 11 | 1..0 | not more than 0.5 | 30 | 4 | *a |
| 1-10 (Inv.) | 1 | 12 | 2.0 | not more than 0.5 | 30 | 5 | |
| 1-11 (Inv.) | 1 | 13 | 1.0 | not more than 0.5 | 30 | 5 | |
| 1-12 (Comp.) | 1 | 1 | 1.0 | 2 | 20 | 1 | |
| 1-13 (Comp.) | 1 | 2 | 2.0 | 3 | 15 | 1 | |
| 1-14 (Comp.) | 1 | 14 | 1.0 | None | 0 | 2 | No cracks |
| 1-15 (Comp.) | 1 | 15 | 3.0 | 3 | 5 | 1 | |
| 1-16 (Comp.) | 1 | 11 | 0.05 | None | 0 | 1 | No cracks |
| 1-17 (Comp.) | 1 | 11 | 6.0 | 2 | 15 | 2 | |

Inv.: Invention,
Comp.: Comparative
*a: Particulate dispersion phases of CMC with a particle size of 0.5 μm were observed.

As is apparent from Table 3, the inventive under layers have excellent water resistance and excellent durability.

Example 2

<<Preparation of a Hydrophilic Layer 1 Coating Liquid>>

A hydrophilic layer 1 coating liquid (paste for hydrophilic layer 1), containing a light heat conversion material and a filler, was prepared according to the following procedures.

<Preparation of Filler Dispersion Liquid>

A filler dispersion liquid having the following composition was prepared.

<Composition of Filler Dispersion Liquid>

| | |
|---|---|
| Aqueous 4% solution of carboxymethyl-cellulose sodium salt (produced by Kanto Kagaku Co., Ltd.) | 32.14 parts by weight |
| Pure water | 32.50 parts by weight |
| Aqueous 10% solution of sodium phosphate dodecyl hydrate (produced by Kanto Kagaku Co., Ltd.) | 6.43 parts by weight |
| Porous metal oxide particles Silton AMT 08 (porous aluminosilicate particles having an average particle size of 0.6 μm, produced by Mizusawa Kagaku Co., Ltd.) | 28.93 parts by weight |

The above materials were mixed in that order, and vigorously stirred.

Subsequently, the following paste for hydrophilic layer 1 having the following composition was prepared. The composition was dispersed at 10000 rpm for 10 minutes in a homogenizer (produced by Nippon Seiki Seisakusho Co., Ltd.). Thus, a paste for hydrophilic layer 1 having a solid content of 25% by weight was prepared.

<Composition of Paste for Hydrophilic Layer 1>

| | |
|---|---|
| Filler dispersion liquid above | 55.56 parts by weight |
| Layer structural clay mineral particles: Montmorillonite Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight | 28.57 parts by weight |
| Cu—Fe—Mn type metal oxide black pigment: TM-3550 black aqueous dispersion {prepared by dispersing TM-3550 black powder having a particle size of 0.1 μm produced by Dainichi Seika Kogyo Co., Ltd. in water to give a solid content of 40.5% by weight (including 0.5% by weight of dispersant)} | 15.87 parts by weight |

The following composition was sufficiently mixed to prepare a colloidal silica mixture liquid.

<Composition of Colloidal Silica Mixture Liquid>

| | |
|---|---|
| Colloidal silica (alkali type): Snowtex S produced by Nissan Kagaku Co., Ltd. (solid 30% by weight) | 24.07 parts by weight |
| Necklace colloidal silica (alkali type): Snowtex PSM produced by Nissan Kagaku Co., Ltd. (solid 20% by weight) | 54.02 parts by weight |
| Aqueous 1% solution of silicon-containing surfactant FZ2161 produced by Nippon Unicar Co., Ltd. | 3.01 parts by weight |

Subsequently, the following compositions were mixed while sufficiently stirring, and filtered to obtain a hydrophilic layer 1 coating liquid.

<Compositions of Hydrophilic Layer 1 Coating Liquid>

| | |
|---|---|
| Paste for hydrophilic layer 1 (obtained above) | 28.00 parts by weight |
| Colloidal silica mixture liquid (obtained above) | 72.00 parts by weight |

The colloidal silica mixture liquid was added little by little to the paste for hydrophilic layer 1 while stirring. The resulting mixture was diluted to obtain a hydrophilic layer 1 coating liquid (also referred to as porous hydrophilic layer 1 coating liquid) with a solid content of 20% by weight.

The hydrophilic layer 1 contained carbon atom-free materials in an amount of 98.9% by weight.

<<Preparation of Image Formation Layer>>

The components in the following composition were mixed while sufficiently stirring, and filtered to prepare an image formation layer coating liquid.

<Composition of Image Formation Layer Coating Liquid>

| | |
|---|---|
| Aqueous 5% by weight solution of disaccharide trehalose powder (Trehaose, mp. 97° C., produced by Hayashihara Shoji Co., Ltd.) | 40 parts by weight |
| Dispersion prepared by diluting with pure water carnauba wax emulsion A118 (having a solid content of 40% by weight, the wax having an average particle size of 0.3 μm, a melting viscosity at 140° C. of 0.008 P · s, a softening point of 65° C., and a melting point of 80° C., produced by GifuCerac Co., Ltd.) to give a solid content of 5% by weight | 60 parts by weight |

<<Preparation of a Printing Plate Material>>

Employing a combination of substrate, under layer, hydrophilic layer, and image formation layer, as shown in Table 4, the under layer, hydrophilic layer, and image formation layer were coated on the substrate in that order to give a thickness of each layer given in Table 4. Thus, printing plate material samples 2-1 through 2-9 were obtained.

In order to obtain a desired thickness of each layer in the layer coating above, a wire bar used for coating was suitably selected and each coating liquid was suitably diluted.

In the above preparation, each of the under layer and the hydrophilic layer, after coated, was dried 80° C. for 5 minutes. After the hydrophilic layer was dried, the resulting material was further aged at 60° C. for 24 hours, and then the image formation layer was coated on the resulting hydrophilic layer, and dried at 55° C. for 3 minutes.

<<Image Formation>>

Each of the printing plate material samples obtained above was wound around a drum for exposure, fixed on the drum, and imagewise exposed to laser beam (having a wavelength of 830 nm and a beam spot diameter of 8 μm) at a resolving degree of 4,000 dpi ("dpi" means a dot number per inch), changing exposure energy at an interval of 25 mJ/cm$^2$ in the range from 150 to 450 mJ/cm$^2$ to form an image. Thus, an exposed printing plate material sample was obtained.

<<Printing Method>>

The exposed printing plate material sample was mounted without being developed on a printing press, DAIYA 1F-1 produced by Mitsubishi Jukogyo Co., Ltd. Printing was carried out employing a coated paper, dampening water a 2% by weight solution of Astromark 3 (produced by Nikken Kagaku Kenkyusyo Co., Ltd.), and printing ink (Toyo King Hyecho M Magenta, produced by Toyo Ink Manufacturing Co.).

<<Evaluation>>

<Sensitivity>

Sensitivity was represented by exposure energy, through which a printing plate was obtained which provided one hundredth printed matter having a good printed image without image blurring or small dot deficiency.

Printing Durability (at Image Portions)>

Printing durability (at image portions) was represented by the number of printed matters at which the solid image began blurring when printing was carried out employing a printing plate obtained from a painting plate material by the exposure energy obtained above. The results are shown in Table 4.

TABLE 4

| Sample No. | Substrate No. | Under layer No. | Thickness (82 m) of under layer | Hydrophilic layer No. | Thickness (μm) of hydrophilic layer | Thickness (82 m) of image formation layer | Sensitivity (mJ/cm$^2$) | Printing durability (printed matter number) |
|---|---|---|---|---|---|---|---|---|
| 2-1 (Inv.) | 3 | 7 | 2.0 | 1 | 1.5 | 0.6 | 225 | ≧10000 |
| 2-2 (Inv.) | 3 | 7 | 1.0 | 1 | 1.5 | 0.6 | 275 | ≧10000 |
| 2-3 (Inv.) | 3 | 8 | 3.0 | 1 | 1.5 | 0.6 | 250 | ≧10000 |
| 2-4 (Inv.) | 3 | 9 | 1.0 | 1 | 1.5 | 0.6 | 275 | ≧10000 |
| 2-5 (Inv.) | 3 | 12 | 1.5 | 1 | 1.5 | 0.6 | 275 | ≧10000 |
| 2-6 (Inv.) | 3 | 12 | 3.0 | 1 | 1.5 | 0.6 | 250 | 10000 |
| 2-7 (Comp.) | 3 | None | — | 1 | 1.5 | 0.6 | >400* | 0** |
| 2-8 (Comp.) | 3 | None | — | 1 | 3.0 | 0.6 | 350 | 3000 |
| 2-9 (Comp.) | 3 | 9 | 0.05 | 1 | 2.0 | 0.6 | >400* | 0** |

Inv.: Invention,
Comp. Comparative
400*: Sensitivity was not less than 400 400 mJ/cm$^2$.
0**: Printing was carried out after 400 mJ/cm$^2$ exposure, but solid parts of image portions were blurred at the beginning of printing.

As is apparent from Table 4 above, the printing plate material employing the under layer in the invention restrains sensitivity lowering caused by use of the aluminum substrate, and further provides a sufficient printing durability employing a practically applicable exposure energy.

Example 3

<<Preparation of Hydrophilic Layer 2 Coating Liquid>>

A hydrophilic layer 2 coating liquid was prepared according to the following procedures.

Components in the following sol-gel liquid composition were mixed in that order, and the resulting mixture was stirred at room temperature for 1 hour to obtain a sol gel liquid.

<Sol Gel Liquid>

| | |
|---|---|
| Tetramethoxysilane | 20.00 parts by weight |
| Ethanol | 40.00 parts by weight |
| Pure water | 39.98 parts by weight |
| Sulfuric acid | 0.02 parts by weight |

Pure water was added to the following composition to make a liquid with a solid content of 20% by weight. The resulting liquid was dispersed for 30 minutes employing a sand grinder containing zirconia beads having a diameter of 0.5 mm, and filtered. Thus, a hydrophilic layer 2 coating liquid was obtained.

<Composition of a Hydrophilic Layer 2 Coating Liquid>

| | |
|---|---|
| Sol gel liquid obtained above | 15.00 parts by weight |
| Colloidal silica (neutral) Snowtex C (solid 20% by weight, produced by Nissan Kagaku Co., Ltd.) | 35.00 parts by weight |
| Aqueous 10% by weight solution of polyvinyl alcohol PVA 117 produced by Kuraray Co., Ltd.) | 20.00 parts by weight |
| Alumina particles (average particle size of 0.05 μm) | 8.00 parts by weight |

The hydrophilic layer 2 coating liquid was coated on the substrate 1 employing a wire bar #6, and dried at 80° C. for 5 minutes. The resulting hydrophilic layer 2 had a glossy surface and it was confirmed according to microscopic observation that the surface of the hydrophilic layer had a flat structure.

The content of the carbon atom-free material in the layer was not more than 90.0% by weight.

<<Preparation of a Printing Plate Material>>

A printing plate material sample was prepared in the same manner as in Example 2, except that a combination of substrate, under layer, hydrophilic layer, and image formation layer, as shown in Table 5, was used, and the under layer, hydrophilic layer, and image formation layer were coated on the substrate in that order to give a thickness of each layer given in Table 5. Thus, printing plate material samples 3-1 through 3-15 were obtained.

<<Image Formation>>

Each of the printing plate material samples obtained above was wound around a drum for exposure, fixed on the drum, and imagewise exposed to laser beam (having a wavelength of 830 nm and a beam spot diameter of 8 μm) at a resolving degree of 4,000 dpi at an exposure energy of 250 mJ/cm$^2$ to form an image. Thus, an exposed printing plate material sample was obtained.

<<Printing Method>>

The exposed printing plate material sample was mounted without being developed on a printing press, DAIYA 1F-1 produced by Mitsubishi Jukogyo Co., Ltd. Printing was carried out employing an uncoated paper Shiorai (produced by DAISHOWA PAPER MFG. Co., Ltd.), dampening water a 2% by weight solution of Astromark 3 (produced by Nikken Kagaku Kenkyusyo Co., Ltd.), and printing ink (Toyo King Hyecho M Magenta, produced by Toyo Ink Manufacturing Co.).

<<Evaluation>>

<Performance at Stating Stage of Printing>

Background contamination at starting stage of printing was visually observed and evaluated. The results are shown in Table 5.

<Stain Elimination Property>

The stain elimination property was represented by the number of printed paper sheets printed from when printing started supplying dampening water and ink onto a printing plate in which an ink layer had been formed on the entire surface of the printing plate by supplying only ink on the printing plate in printing till when prints having good image were obtained.

<Printing Durability (at Image Portions)>

Printing durability at image portions was represented by the number of printed paper sheets printed from when printing started, to when solid images on the prints became blurred. The results are shown in Table 5.

<Printing Durability (at Non-Image Portions)>

Printing durability at non-image portions was represented by the number of printed paper sheets printed from when printing started, to when stain spots were produced at the non-image portions of the printed paper sheets. Herein, the time when stain spots were produced at the non-image portions refers to the time when not less than five stain spots per 100 mm square of non-image portions of the printed paper sheets were produced. The results are shown in Table 5.

TABLE 5

| | | Under layer | | Hydrophilic layer | | | | Stain elimination property | Printing durability | Printing durability |
|---|---|---|---|---|---|---|---|---|---|---|
| Sample No. | Sub-strate No. | No. | Thick-ness (μm) | No. | Thick-ness (μm) | *1 | *2 | (printed paper sheet number) | (at non-image portions) | (at non-image portions) |
| 3-1 (Inv.) | 2 | 3 | 1.0 | 1 | 1.5 | 0.5 | good | 35 | ≧10000 | 8000 |
| 3-2 (Inv.) | 2 | 4 | 1.0 | 1 | 1.5 | 0.5 | good | 30 | ≧10000 | ≧10000 |
| 3-3 (Inv.) | 2 | 5 | 1.5 | 1 | 1.5 | 0.5 | good | 30 | ≧10000 | ≧10000 |
| 3-4 (Inv.) | 2 | 6 | 0.5 | 1 | 1.5 | 0.5 | good | 30 | ≧10000 | ≧10000 |
| 3-5 (Inv.) | 2 | 7 | 1.0 | 1 | 1.5 | 0.5 | good | 30 | ≧10000 | 9000 |
| 3-6 (Inv.) | 2 | 10 | 1.0 | 1 | 1.5 | 0.5 | good | 30 | ≧10000 | 9000 |
| 3-7 (Inv.) | 2 | 11 | 2.0 | 1 | 1.5 | 0.5 | good | 30 | ≧10000 | ≧10000 |
| 3-8 (Inv.) | 2 | 12 | 1.0 | 1 | 1.0 | 0.5 | good | 25 | ≧10000 | ≧10000 |
| 3-9 (Inv.) | 2 | 13 | 1.5 | 1 | 0.7 | 0.5 | good | 20 | ≧10000 | ≧10000 |
| 3-10 (Comp.) | 2 | None | — | 1 | 1.5 | 0.5 | good | 30 | ≧10000 | 3000 |
| 3-11 (Comp.) | 2 | None | — | 1 | 3.0 | 0.5 | good | 45 | ≧10000 | 5000 |
| 3-12 (Comp.) | 2 | 1 | 1.0 | 1 | 1.5 | 0.5 | good | 30 | 1000* | 1000* |
| 3-13 (Comp.) | 2 | 14 | 1.0 | 1 | 1.5 | 0.5 | good | 30 | 2000* | 2000* |
| 3-14 (Comp.) | 2 | 6 | 0.05 | 1 | 1.5 | 0.5 | good | 30 | ≧10000 | 4000 |

TABLE 5-continued

| Sample No. | Sub-strate No. | Under layer No. | Under layer Thick-ness (μm) | Hydrophilic layer No. | Hydrophilic layer Thick-ness (μm) | *1 | *2 | Stain elimination property (printed paper sheet number) | Printing durability (at non-image portions) | Printing durability (at non-image portions) |
|---|---|---|---|---|---|---|---|---|---|---|
| 3-15 (Comp.) | 2 | 11 | 1.0 | 2 | 1.0 | 0.5 | stain | 50 | 300* | ≧10000 |

Inv.: Invention,
Comp. Comparative
*Layer exfoliation at the under layer occurred.
**Image formation was insufficient.
*1Thickness (μm) of image formation layer
*2Performance at starting stage of printing As is apparent from Table 5, the inventive printing plate material samples provide a printing plate having excellent printing durability as well as excellent printing performance, even when printing is carried out employing an uncoated paper.

EFFECTS OF THE INVENTION

The present invention provides a printing plate material comprising a hydrophilic layer which can be applied to a CTP system which does not require special development, and provides good printing performance, and further provides a printing plate material comprising a layer having high strength, which provides high printing durability even when printing is carried out employing an uncoated paper.

What is claimed is:

1. A printing plate material comprising a substrate, and provided thereon, an under layer, a porous hydrophilic layer and an image formation layer in that order, wherein the under layer has a thickness of from 0.1 to 5.0 μm, contains metal oxide particles A with a particle size of from 1 to 20 nm in an amount of not less than 30% by weight, and has cracks with a groove width of less than 1 μm and the image formation layer contains at least one selected from the group consisting of heat-fusible particles and thermoplastic particles.

2. The printing plate material of claim 1, wherein the frequency of the cracks is such that when an arbitrary line with a length of 100 μm is drawn on the surface of the under layer, the line intersects with the cracks at points of from 1 to 100.

3. The printing plate material of claim 1, wherein the metal oxide particles A are colloidal silica particles.

4. The printing plate material of claim 1, wherein not less than 91% by weight of components constituting the hydrophilic layer are carbon atom-free materials.

5. The printing plate material of claim 1, wherein the hydrophilic layer contains a light-heat conversion material.

6. The printing plate material of claim 1, wherein the under layer further contains particles B with a particle size of from 50 nm to 1 μm.

7. The printing plate material of claim 6, wherein the metal oxide particles B have a new Mohs' hardness of not less than 5.

8. The printing plate material of claim 6, wherein the particles B are metal oxide particles having light-heat conversion function.

9. The printing plate material of claim 6, wherein the particles B are organic particles having a Tg of not less than 100° C.

10. The printing plate material of claim 9, wherein the organic particles are hollow.

11. The printing plate material of claim 6, wherein the particles B are fatty acid amide particles.

12. The printing plate material of claim 1, wherein the under layer further contains layer structural clay mineral particles.

13. The printing plate material of claim 1, wherein the image formation layer contains a water soluble material.

14. The printing plate material of claim 13, wherein the water soluble material is a saccharide.

15. The printing plate material of claim 14, wherein the saccharide is an oligosaccharide.

* * * * *